US011183982B2

(12) United States Patent
Tajalli

(10) Patent No.: US 11,183,982 B2
(45) Date of Patent: Nov. 23, 2021

(54) VOLTAGE SAMPLER DRIVER WITH ENHANCED HIGH-FREQUENCY GAIN

(71) Applicant: Kandou Labs, S.A., Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 71 days.

(21) Appl. No.: 16/702,260

(22) Filed: Dec. 3, 2019

(65) Prior Publication Data

US 2020/0106412 A1    Apr. 2, 2020

Related U.S. Application Data

(63) Continuation of application No. 16/012,649, filed on Jun. 19, 2018, now Pat. No. 10,498,305, which is a
(Continued)

(51) Int. Cl.
*H03F 3/45* (2006.01)
*H03G 3/30* (2006.01)
(Continued)

(52) U.S. Cl.
CPC ....... *H03G 3/3036* (2013.01); *H03F 3/45179* (2013.01); *H03F 3/45183* (2013.01);
(Continued)

(58) Field of Classification Search
CPC .... H03F 3/45; H03F 3/45596; H03F 3/45744; H03F 3/45892; H03F 3/45968
(Continued)

(56) References Cited

U.S. PATENT DOCUMENTS

| 3,636,463 A | 1/1972 | Ongkiehong |
| 3,824,494 A | 7/1974 | Wilcox |

(Continued)

FOREIGN PATENT DOCUMENTS

| EP | 0425064 A2 | 5/1991 |
| WO | 2018052657 A1 | 3/2018 |
| WO | 2019241081 A1 | 12/2019 |

OTHER PUBLICATIONS

Anadigm , "Using the Anadigm Multiplier CAM", Design Brief 208, www.anadigm.com, Copyright 2002, 2002, (6 pages).
(Continued)

*Primary Examiner* — Steven J Mottola
(74) *Attorney, Agent, or Firm* — Invention Mine LLC

(57) ABSTRACT

Methods and systems are described for receiving, at an input differential branch pair, a set of input signals, and responsively generating a first differential current, receiving, at an input of an offset voltage branch pair, an offset voltage control signal, and responsively generating a second differential current, supplementing a high-frequency component of the second differential current by injecting a high-pass filtered version of the set of input signals into the input of the offset voltage branch pair using a high-pass filter, and generating an output differential current based on the first and second differential currents using an amplifier stage connected to the input differential branch pair and the offset voltage branch pair.

20 Claims, 19 Drawing Sheets

Related U.S. Application Data continuation of application No. 15/415,831, filed on Jan. 25, 2017, now Pat. No. 10,003,315.

(60) Provisional application No. 62/286,717, filed on Jan. 25, 2016.

(51) Int. Cl.
  *H04L 25/02* (2006.01)
  *H04L 25/06* (2006.01)
  *H04L 25/03* (2006.01)

(52) U.S. Cl.
  CPC ..... *H03F 3/45197* (2013.01); *H03F 3/45632* (2013.01); *H03G 3/3089* (2013.01); *H04L 25/0272* (2013.01); *H04L 25/03133* (2013.01); *H04L 25/06* (2013.01); *H03F 2200/366* (2013.01); *H03F 2203/45022* (2013.01)

(58) Field of Classification Search
  USPC .................................................. 330/252–261
  See application file for complete search history.

(56) References Cited

U.S. PATENT DOCUMENTS

| | | |
|---|---|---|
| 3,939,468 A | 2/1976 | Mastin |
| 4,276,543 A | 6/1981 | Miller et al. |
| 4,774,498 A | 9/1988 | Traa |
| 4,897,657 A | 1/1990 | Brubaker |
| 5,017,924 A | 5/1991 | Guiberteau et al. |
| 5,459,465 A | 10/1995 | Kagey |
| 5,510,736 A | 4/1996 | Van |
| 5,748,948 A | 5/1998 | Yu et al. |
| 5,777,568 A | 7/1998 | Inoue |
| 5,793,254 A | 8/1998 | Oconnor |
| 5,945,935 A | 8/1999 | Kusumoto et al. |
| 6,094,075 A | 7/2000 | Garrett et al. |
| 6,226,330 B1 | 5/2001 | Mansur |
| 6,232,908 B1 | 5/2001 | Nakaigawa |
| 6,346,907 B1 | 2/2002 | Dacy et al. |
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,546,063 B1 | 4/2003 | Lee et al. |
| 6,563,382 B1 | 5/2003 | Yang |
| 6,624,699 B2 | 9/2003 | Yin et al. |
| 6,839,587 B2 | 1/2005 | Yonce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,285,977 B2 | 10/2007 | Kim |
| 7,372,295 B1 | 5/2008 | Wei |
| 7,372,390 B2 | 5/2008 | Yamada |
| 7,397,302 B2 | 7/2008 | Bardsley et al. |
| 7,528,758 B2 | 5/2009 | Ishii |
| 7,560,957 B2 | 7/2009 | Chen et al. |
| 7,635,990 B1 | 12/2009 | Ren et al. |
| 7,656,321 B2 | 2/2010 | Wang |
| 7,683,720 B1 | 3/2010 | Yehui et al. |
| 7,688,102 B2 | 3/2010 | Bae et al. |
| 7,688,887 B2 | 3/2010 | Gupta et al. |
| 7,697,915 B2 | 4/2010 | Behzad et al. |
| 7,804,361 B2 | 9/2010 | Lim et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,537,886 B1 | 9/2013 | Shumarayev et al. |
| 8,547,272 B2 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,704,583 B2 | 4/2014 | Bulzacchelli et al. |
| 8,791,735 B1 | 7/2014 | Shibasaki |
| 8,841,936 B2 | 9/2014 | Nakamura |
| 8,860,590 B2 | 10/2014 | Yamagata et al. |
| 8,861,583 B2 | 10/2014 | Liu |
| 9,069,995 B1 | 6/2015 | Cronie |
| 9,106,462 B1 | 8/2015 | Aziz et al. |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,292,716 B2 | 3/2016 | Winoto et al. |
| 9,300,503 B1 | 3/2016 | Holden et al. |
| 9,705,708 B1 | 7/2017 | Jin et al. |
| 9,755,599 B2 | 9/2017 | Yuan et al. |
| 10,003,315 B2 | 6/2018 | Tajalli |
| 10,326,623 B1 | 6/2019 | Tajalli |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1 | 7/2003 | Hsieh |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0008099 A1 | 1/2005 | Brown |
| 2005/0057379 A1 | 3/2005 | Jansson |
| 2005/0218980 A1* | 10/2005 | Kalb .............. H03F 1/301 330/253 |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0097579 A1 | 5/2007 | Amamiya |
| 2007/0104299 A1 | 5/2007 | Cahn et al. |
| 2007/0159247 A1 | 7/2007 | Lee et al. |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2007/0285156 A1 | 12/2007 | Roberts et al. |
| 2008/0001626 A1 | 1/2008 | Bae et al. |
| 2008/0107209 A1 | 5/2008 | Cheng et al. |
| 2008/0165841 A1 | 7/2008 | Wall et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0146719 A1 | 6/2009 | Pernia et al. |
| 2009/0323864 A1 | 12/2009 | Tired |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0133816 A1 | 6/2011 | Wu et al. |

(56) References Cited

U.S. PATENT DOCUMENTS

| | | |
|---|---|---|
| 2011/0156819 A1 | 6/2011 | Kim et al. |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2012/0249217 A1 | 10/2012 | Fukuda et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1 | 6/2014 | Yang |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0197747 A1 | 7/2016 | Ulrich et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2017/0302237 A1 | 10/2017 | Akter et al. |
| 2017/0309346 A1 | 10/2017 | Tajalli et al. |
| 2018/0076985 A1 | 3/2018 | Schell |
| 2019/0199557 A1 | 6/2019 | Taylor et al. |
| 2019/0221153 A1 | 7/2019 | Tsuchi et al. |
| 2019/0379563 A1 | 12/2019 | Tajalli et al. |
| 2020/0321778 A1 | 10/2020 | Gharibdoust et al. |
| 2021/0248103 A1 | 8/2021 | Khashaba et al. |

OTHER PUBLICATIONS

Kim, Kyu-Young , et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Schneider, J., et al., "ELEC301 Project: Building an Analog Computer", http://www.clear.rice.edu/elec301/Projects99/anlgcomp/, Dec. 19, 1999, (9 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Tierney, J., "A Digital Frequency Synthesizer", Audio and Electroacoustics, IEEE Transactions, pp. 48-57, vol. 19, No. 1, Abstract, Mar. 1971, (1 page).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

Dickson, Timothy , et al., "A 1.8 pJ/bit 16×16 GB/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Palmisano, G. , et al., "A Replica Biasing for Constant-Gain CMOS Open-Loop Amplifiers", Circuits and Systems, IEEE International Symposium in Monterey, CA, May 31, 1998, 363-366 (4 pages).

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

* cited by examiner

Mix [ 1/2 1/2 -1 0 0 0 ]

VOLTAGE SAMPLER DRIVER WITH ENHANCED HIGH-FREQUENCY GAIN

CROSS-REFERENCES TO PRIORITY AND RELATED APPLICATIONS

This application is a continuation of U.S. application Ser. No. 16/012,649, filed Jun. 19, 2018, naming Armin Tajalli, entitled "Voltage Sampler Driver with Enhanced High Frequency Gain" now U.S. Pat. No. 10,498,305, issued Dec. 3, 2019, which is a continuation of U.S. application Ser. No. 15/415,831 filed Jan. 25, 2017, naming Armin Tajalli, entitled "Voltage Sampler Driver with Enhanced High-Frequency Gain", now U.S. Pat. No. 10,003,315, issued Jun. 19, 2018, which claims the benefit of U.S. Provisional Patent Application No. 62/286,717, filed Jan. 25, 2016, naming Armin Tajalli, entitled "Voltage Sampler Driver with Enhanced High-Frequency Gain," all of which are hereby incorporated herein by reference in their entirety for all purposes.

REFERENCES

The following references are hereby incorporated herein by reference in their entirety for all purposes:

U.S. Patent Publication 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. Pat. No. 8,649,445, issued Feb. 11, 2014 of U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and U.S. Pat. No. 8,718,184, issued May 6, 2014 of U.S. patent application Ser. No. 13/463,742, filed May 3, 2012, naming Harm Cronie and Amin Shokrollahi, entitled "Finite State Encoders and Decoders for Vector Signaling Codes" (hereafter called "Cronie IV").

U.S. Pat. No. 9,300,503, issued Mar. 29, 2016 of U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", (hereinafter identified as "Holden I");

U.S. Pat. No. 9,077,386, issued Jul. 7, 2015 of U.S. patent application Ser. No. 13/603,107, filed Sep. 9, 2012, naming Brian Holden and Amin Shokrollahi, entitled "Methods and Systems for Selection of Unions of Vector Signaling Codes for Power and Pin Efficient Chip-To-Chip Communication" (hereinafter called "Holden II").

U.S. Pat. No. 8,989,317, issued Mar. 24, 2015 of U.S. patent application Ser. No. 13/671,426, filed Nov. 7, 2012, naming Brian Holden and Amin Shokrollahi, entitled "Crossbar Switch Decoder for Vector Signaling Codes" (hereinafter called "Holden III").

U.S. Provisional Patent Application 61/839,360, filed Jun. 23, 2013, naming Amin Shokrollahi, entitled "Vector Signaling with Reduced Receiver Complexity" (hereinafter "Shokrollahi I");

U.S. Provisional Patent Application No. 61/839,360, filed Jun. 23, 2013, naming Amin Shokrollahi, entitled "Vector Signaling Codes with Reduced Receiver Complexity", hereinafter identified as [Shokrollahi II].

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi III].

U.S. Pat. No. 9,288,082, issued Mar. 15, 2016 of U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

The following additional references to prior art have been cited in this application:

"The StrongARM Latch, Behzad Razavi"," IEEE Solid-State Circuits Magazine, Spring 2015, pp. 12-17, DOI 10.1109/MSSC2015.2418155, hereinafter identified as [Razavi].

"A Double-Tail Latch-Type Voltage Sense Amplifier with 18 ps Setup+Hold Time," Analog Techniques and PLLs, Feb. 13, 2007, pp 314-315, 605, hereinafter identified as [Schinkel].

BACKGROUND

In communication systems, information may be transmitted from one physical location to another. Furthermore, it is typically desirable that the transport of this information is reliable, is fast and consumes a minimal amount of resources. One of the most common information transfer mediums is the serial communications link, which may be based on a single wire circuit relative to ground or other common reference, multiple such circuits relative to ground or other common reference, or multiple circuits used in relation to each other. An example of the latter utilizes differential signaling (DS). Differential signaling operates by sending a signal on one wire and the opposite of that signal on a paired wire; the signal information is represented by the difference between the wires rather than their absolute values relative to ground or other fixed reference.

Differential signaling enhances the recoverability of the original signal at the receiver, over single ended signaling (SES), by cancelling crosstalk and other common-mode noise, but a side benefit of the technique is that the Simultaneous Switching Noise (SSN) transients generated by the two signals together is nearly zero; if both outputs are presented with an identical load, the transmit demand on its power supply will be constant, regardless of the data being sent. Any induced currents produced by terminating the differential lines in the receiver will similarly cancel out, minimizing noise induction into the receiving system.

There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, and Cronie IV.

While non-binary vector signaling methods can provide substantial improvements regarding the tradeoff of pin-efficiency, power efficiency and noise resilience as compared to traditional signaling methods, there are some applications wherein additional improvements are possible.

BRIEF SUMMARY

Methods and systems are described for an apparatus including a voltage sampler driver for generating an output differential current from at least a first and a second differential current, the voltage sampler driver including an input differential branch pair for receiving a set of input signals, each branch of the differential branch pair including one or more transistors for generating the first differential current and an offset voltage branch pair for receiving, at an input, an offset voltage control signal, each branch of the offset differential branch pair including one or more transistors for generating the second differential current. The apparatus further includes an amplifier stage connected to the voltage sampler driver, the amplifier stage for generating a differential output voltage based on the output differential current, and a high-pass filter for supplementing a high-frequency component of the second differential current by injecting a high-pass filtered version of the set of input signals into the input of the offset voltage branch pair.

In some embodiments, the voltage sampler driver further includes respective tail current sources, the respective tail current sources periodically enabling the input differential branch pair and offset differential branch pair. In some embodiments, the respective tail current sources are periodically enabled according to an input clock signal. In some embodiments, current magnitudes of the respective tail current sources are independently tunable.

In some embodiments, the amplification stage includes a pair of load resistors for generating a differential output voltage based on the differential current drawn.

In some embodiments, the amplification stage includes an active device. In some embodiments, the active device is a MOS device. In some embodiments, the MOS device is periodically enabled to implement a discrete time domain integrator.

In some embodiments, the set of input signals correspond to symbols of a codeword of an orthogonal-differential vector signaling code (ODVS). In some embodiments, the set of input signals correspond to symbols of a codeword of a permutation modulation (PM) code.

In some embodiments, a first branch of the input differential branch pair comprises at least two transistors connected in parallel. In some embodiments, a first branch of the offset voltage branch pair comprises a number of transistors equal to a number of transistors in the first branch of the input differential branch pair.

In some embodiments, each branch of the input differential branch pair and each branch of the offset correction branch pair comprise a single transistor. In some embodiments, each transistor in the input differential branch pair and the offset voltage branch pair has a weight associated with transistor characteristics. In some embodiments, each weight is determined by a corresponding value of a row of an orthogonal matrix.

In some embodiments, the input differential branch pair comprises a frequency-selective impedance connected at a common node connecting the pair of branches in the input differential branch pair. In some embodiments, the frequency-selective impedance comprises a resistor-capacitor network.

In some embodiments, the apparatus further includes a multi-input comparator (MIC) for providing the set of input signals as a differential input signal. In some embodiments, the input differential signal represents a combination of a plurality of symbols of a codeword.

In some embodiments, the amplifier stage includes an integrator circuit for generating a differential output voltage based on the differential currents. In some embodiments, the integrator is a discrete time integrator with periodically enabled load devices. In some embodiments, a single wire of the differential voltage output represents a single-ended output. In some embodiments, the amplifier is a voltage mode amplifier.

In some embodiments, the apparatus further includes a comparator for forming a single-ended output by slicing the differential voltage output.

In some embodiments, the offset voltage control signal accounts for an offset error introduced by components of the voltage sampler driver and/or the amplifier stage. In some embodiments, the voltage sampler driver includes NMOS transistors. In some embodiments, the voltage sampler driver includes PMOS transistors.

In some embodiments, the offset voltage control signal represents an arbitrary reference voltage.

In some embodiments, the amplifier stage includes a pair of load resistors for generating the differential output voltage based on the output differential current. In some embodiments the amplifier stage further includes a pair of capacitors, each capacitor connected between one terminal of a corresponding load resistor and ground. In some embodiments, the pair of load resistors are tunable. In some embodiments, the amplifier stage further includes an adjustable current tail source.

In some embodiments, a product of a current magnitude of the adjustable current tail source and an impedance magnitude of one of the load resistors is constant, and the pair of load resistors and the tunable current source have a bandwidth control input to adjust bandwidth. In alternative embodiments, a product of a current magnitude of the tunable current tail source and an impedance magnitude of one of the load resistors is not constant, the pair of load resistors and the current source having a power control input to adjust power consumption.

In some embodiments, each tunable load resistor includes a plurality of resistors in a parallel network, each resistor of the plurality having a corresponding switch connected between the resistor and a common node of the parallel network, and wherein each switch connects/disconnects the resistor from the parallel network based on a respective control signal.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of described embodiments will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

DETAILED DESCRIPTION

Figure 1:
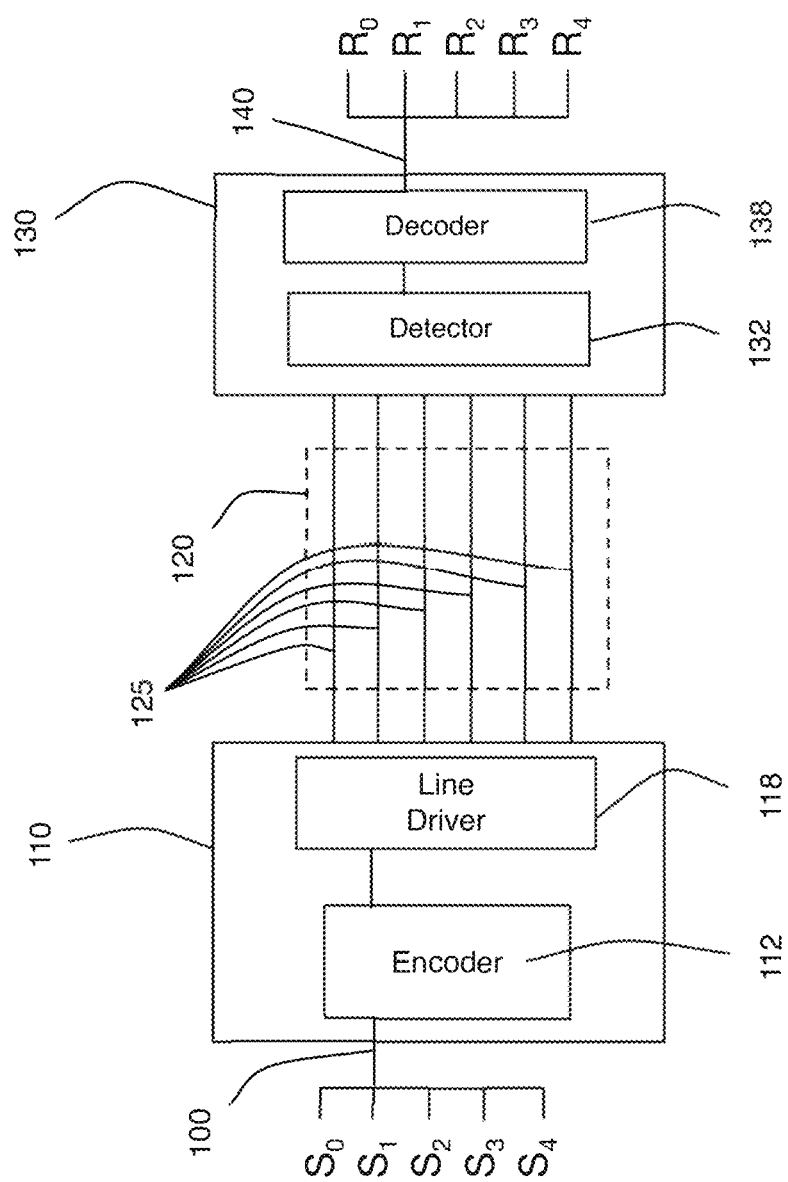
FIG. 1 depicts a communications system in accordance with some embodiments.

FIG. 1 illustrates a communication system in accordance with some embodiments employing a vector signaling code. Source data to transmitter 110, herein illustrated as $S_0$, $S_1$, $S_2$, $S_3$, $S_4$ enters as a source data word 100 into encoder 112. The size of the source data word may vary and depends on the parameters of the vector signaling code. The encoder 112 generates a codeword of the vector signaling code for which the system is designed. In operation, the codeword produced by encoder 112 is used to control PMOS and NMOS transistors within driver 118, generating two, three, or more distinct voltages or currents on each of the N communication wires 125 of communications channel 120, to represent the N symbols of the codeword. In the embodiment of FIG. 1, the size of the source data word is shown as five bits and the codeword size is six symbols. Thus, communications channel 110 is shown as being comprised of six signal wires 125, each transporting one codeword symbol. One familiar with the encoding arts may also describe this code as having a block length of six (i.e. producing an output word of six symbols) and a code size of 32 (i.e. having 32 distinct codewords, sufficient to encode 5 binary bits of data.)

Within communications receiver 130, detector 132 reads the voltages or currents on wires 125, possibly including amplification, frequency compensation, and common mode signal cancellation. In the present example, the received results 140, herein shown as $R_0$, $R_1$, $R_2$, $R_3$, $R_4$, are provided directly by detector 132, without need of optional decoder 138.

As will be readily apparent, different codes may be associated with different block sizes and different codeword sizes; for descriptive convenience and without implying limitation, the example of FIG. 1 illustrates a system using an ODVS code capable of encoding five binary bit values for transmission over six wires, a so-called 5b6w code.

Depending on which vector signaling code is used, there may be no decoder, or no encoder, or neither a decoder nor an encoder. For example, for the 8b8w code disclosed in [Cronie II], both encoder 112 and decoder 138 exist. On the other hand, for the 5b6w code of the present example, an explicit decoder is unnecessary, as the system may be configured such that detector 132 generates the received results 140 directly.

The operation of the communications transmitter 110 and communications receiver 130 have to be completely synchronized in order to guarantee correct functioning of the communication system. In some embodiments, this synchronization is performed by an external clock shared between the transmitter and the receiver. Other embodiments may combine the clock function with one or more of the data channels, as in the well-known Biphase encoding used for serial communications, or other methods described herein.

Advanced Detectors for Vector Signaling

Cronie I, Cronie II, and Holden II describe methods of detecting the symbols that have been sent on a vector signaling link. This disclosure describes several additional methods.

As described by Holden I, a detection mechanism called maximum-likelihood decoding for use where permutation modulation coding is used for chip-to-chip communication.

Holden II teaches a decoder using comparators that compare signal values on two communication wires, producing results that inform sorting or ranking actions within such decoder.

The operation of such a comparator can be succinctly described using the "sign" notation, given in the following: sign(x)=+1 if x>0, sign(x)=−1 if x<0, and sign(x) is undefined if x=0. That is, if two values entering a comparator are equal, or close to equal, then the value output by the comparator can be a+1 or a −1, and it is not clear a-priori which of these values is output. Such comparators are called "simple comparators" hereinafter.

In some applications, it may be the case that simple comparators are not sufficient to detect the codewords of a vector signaling code. As an example, consider the union of two PM-codes, one generated as permutations of the vector (1,0,0,−1), and one generated as permutations of the vector (1,1,−1,−1). This union contains 18 codewords, whereas each constituent PM-code contains at most 12 codewords, versus the 16 unique codewords needed to represent a four-bit data value. It is therefore not possible to transmit 4 bits on 4 wires using one PM-code alone, whereas with the union of these two PM-codes a full pin-efficient transmission on 4 wires is possible. Such transmission will be feasible if detection of the codewords can be done with efficient circuitry. It is easy to see that even a full set of 6 simple comparators between pairs of wires is not sufficient to detect a codeword, as those comparisons give no information as to which of the two constituent PM-codes include the received word.

In an application where the values on n communication wires need to be ranked, the number of simple comparators needed is n*(n−1)/2, the number of all un-ordered pairs of integers in the range 1, 2, . . . , n. In some applications this number may be too large. For example, where n is 10, the number of simple comparators used is 45, which may be too large to permit implementation in a given application.

For these reasons, it is important to devise circuits that can be implemented more efficiently than those requiring unacceptable numbers of simple comparators, as well as enabling detection of codewords that would otherwise be undetectable. Such circuits will be described, using an element that hereinafter is termed a multi-input comparator.

A multi-input comparator with coefficients (also referred to as input weighting factors) $a_0, a_1, \ldots, a_{m-1}$ is a circuit that accepts as its input a vector $(x_0, x_1, \ldots, x_{m-1})$ and outputs $$\text{sign}(a_0*x_0+ \ldots +a_{m-1}*x_{m-1}), \quad \text{(Eqn. 1)}$$

with the definition of the sign-function given above. As such, a simple comparator may be seen to be a two input multi-input comparator with coefficients 1 and −1, hence may be considered to be a special case of a multi-input comparator.

Figure 2A:
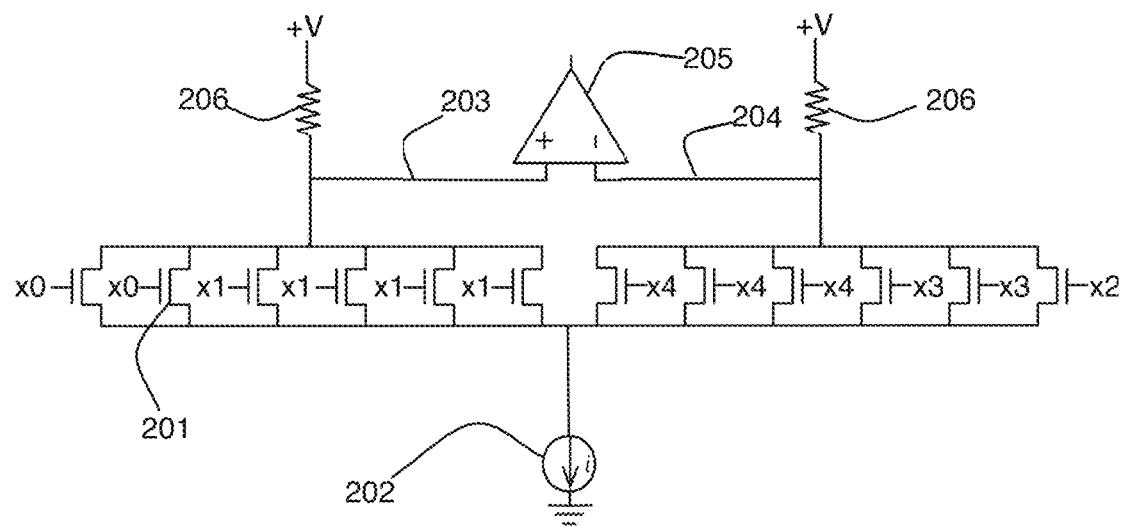
FIGS. 2A and 2B are schematic diagrams of a multi-input comparator (MIC) in accordance with some embodiments.

In accordance with at least one embodiment, the coefficients of a multi-input comparator are integers. In such cases, one circuit implementation of a multi-input comparator is given with reference to FIG. 2A, showing coefficients of 2, 4, −1, −2, −3 for the input values $x_0$ through $x_4$ respectively. In this example, each of the twelve input transistors 201 are identical, representing an extended differential input stage sharing current source 202, followed by differential comparator stage 205. As all transistors 201 are identical, the contributions of inputs $x_0$ and $x_1$ to positive summing node 203, and of inputs $x_2$, $x_3$, and $x_4$ to negative summing node 204 are weighted in proportion to the number of input transistors controlled by each such input. Resistors 206 are shown as passive pull-ups on summing nodes 203 and 204; in some embodiments their function will be incorporated in that of differential comparator 205. Assuming sufficiently high gain in differential comparator 205 to obtain a digital result, its output represents the sign( ) operation taken on the difference between positive summing node 203 and negative summing node 204. Thus, the circuit of FIG. 2A implements Eqn. 1, where inputs with positive coefficients are attached to transistors 201 associated with positive summing node 203, and inputs with negative coefficients are attached to transistors 201 associated with negative summing node 204, the coefficient values being represented by the number of identical input transistors 201 used for each input.

Figure 2B:
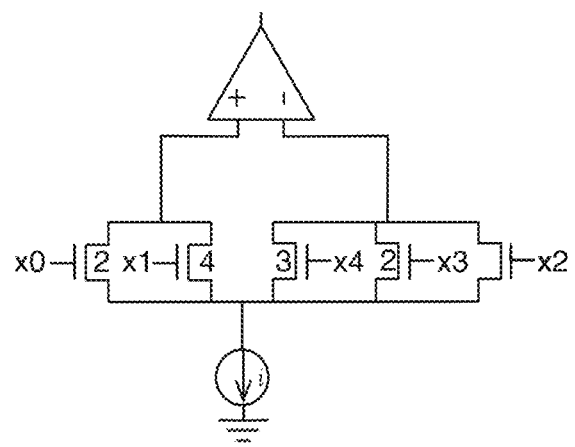

Another multi-input comparator also having the same coefficients is illustrated using a simplified notation in FIG. 2B, where for every input the multiplicity of that input in terms of transistors is a given as a number adjacent to the corresponding transistor. In accordance with at least one embodiment, such multiple paralleled transistors for the same input may be implemented as single transistors having an equivalently scaled channel width, transfer current, or comparable functional characteristics as such multiple paralleled transistors. Another embodiment produces equivalent results dynamically, with inputs controlling the amount of charge on capacitors scaled in proportion to input weights, which are then discharged into a summing node.

A multi-input comparator is common mode resistant if the sum of all its coefficients is zero. It is easy to see that if a multi-input comparator is common mode resistant, then simultaneously increasing the values of its inputs by the same amount will not result in any change of the output of the multi-input comparator.

Multi-input comparators may be susceptible to more thermal noise than simple comparators. If the inputs of a multi-input comparator are independently changed by additive white Gaussian noise of mean 0 and variance $\sigma^2$, the output of the comparator is perturbed by additive white Gaussian noise of mean 0 and variance $$\sigma^2(a_0^2+ \ldots +a_{m-1}^2) \quad \text{(Eqn. 2)}$$

If, for a given input $(x_0, x_1, x_2, \ldots, x_{m-1})$ and $(y_0, y_1, y_2, \ldots, y_{t-1})$ the value $$\alpha = \frac{a_0 x_0 + \ldots + a_{m-1} x_{m-1}}{(a_0^2 + \ldots + a_{m-1}^2)} V \quad \text{(Eqn. 3)}$$

is nonzero, then the error probability of this multi-input comparator is $Q_\sigma(\alpha)$, wherein $Q_\sigma(x)$ is the probability that a normal random variable of mean 0 and variance $\sigma^2$ has a value larger than or equal to x. Hereinafter we call $\alpha$ the "sensitivity" of the multi-input comparator with respect to its input. Note that by definition sensitivity is nonzero, i.e. if the input of a multi-input comparator is such that the value $\alpha$ as defined in Eqn. 3 is zero, then the sensitivity of the comparator with respect to that particular input is "undefined."

A set S of multi-input comparators is said to "detect" a vector signaling code C if the following holds: For any two codewords c and d, there is a multi-input comparator in the set S such that the value of that comparator on both c and d is not undefined, and the values are different. This means that the codewords of the vector signaling code are uniquely determined by the outputs of all the multi-input comparators in S when the codeword is used as the input. If a set S of multi-input comparators detects the vector signaling code C, then we define the "minimum sensitivity" of S with respect to C as the minimum sensitivity of any of the comparators applied to any of the codewords, provided that the sensitivity is defined. The notion of minimum sensitivity stands for the maximum amount of thermal noise that can be applied to the codewords while guaranteeing a given detection error probability. Several examples below will illustrate this notion.

Figure 3A:
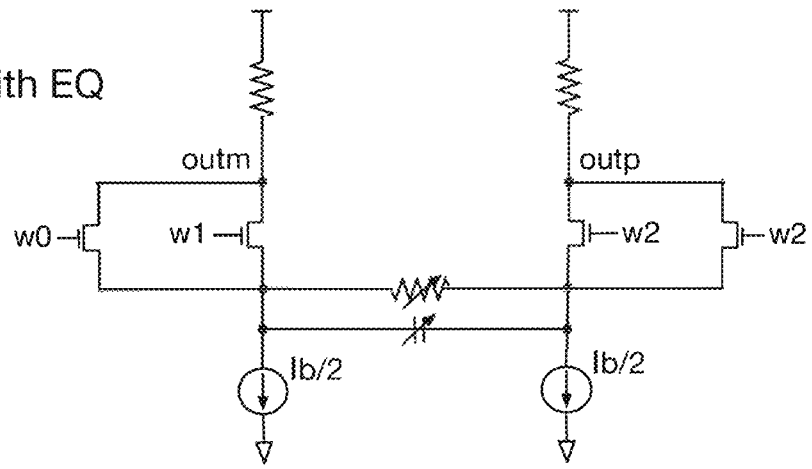
FIGS. 3A and 3B depicts a multi-input comparator with input weights as defined by row 3 of the matrix of Eqn. 4, with and without equalization, respectively, in accordance with some embodiments.
Figure 3B:
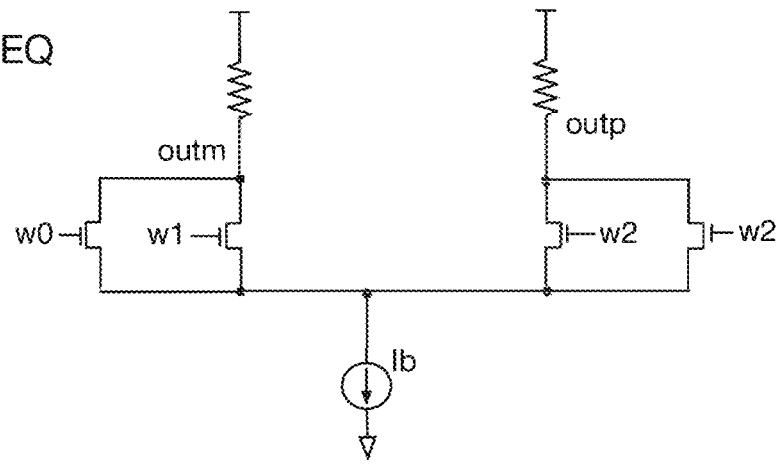

In some embodiments, the output of the MICs may not be sliced using a simple two input comparator, rather a differential output voltage may be provided. FIGS. 3A and 3B depicts schematics of MICs with and without EQ, respectively, in accordance with such embodiments. The MIC with EQ of FIG. 3A includes a frequency-selective impedance connecting the sources of all the transistors. In some embodiments as shown, the frequency-selective impedance includes a tunable resistor and a tunable capacitor. In some embodiments the frequency-selective impedance may be used to tune the bandwidth of the MIC. The weights applied to the MICs shown in FIGS. 3A and 3B correspond to row 3 of the matrix shown below in Eqn. 4.

Receivers Using Multi-Input Comparators

Mathematically, the set of multi-input comparators comprising a code receiver may be concisely described using matrix notation, with the columns of the matrix corresponding to consecutive elements of input vector $(x_0, x_1, \ldots, x_{m-1})$ i.e. the plurality of signal conductor or wire inputs carrying the vector signaling code, and each row of the matrix corresponding to the vector defining a particular multi-input comparator and its output. In this notation, the value of matrix element corresponds to the weight vector or set of scaling factors applied to that column's input values by that row's multi-input comparator.

The matrix of Eqn. 4 describes one such set of multi-input comparators comprising a code receiver.

$$\begin{pmatrix} 1 & 1 & 1 & 1 & 1 & 1 \\ 1 & -1 & 0 & 0 & 0 & 0 \\ 1/2 & 1/2 & -1 & 0 & 0 & 0 \\ 0 & 0 & 0 & 1 & -1 & 0 \\ 0 & 0 & 0 & 1/2 & 1/2 & -1 \\ 1/3 & 1/3 & 1/3 & -1/3 & -1/3 & -1/3 \end{pmatrix} \quad \text{(Eqn. 4)}$$

In this embodiment, six input wires, represented by the six matrix columns, are processed by five multi-input comparators represented by matrix rows 2-6. For purposes to be subsequently described, the first matrix row is composed of all "1" values, creating a square 6×6 matrix. The matrix described by Eqn. 4 will herein be referred to as a Glasswing Receiver matrix.

As used herein, a matrix M such as that of Eqn. 4 is called "orthogonal" if $M^T M = D$ that is, if the product of the matrix and its transpose is a diagonal matrix having non-zero values only on its diagonal. This is a weaker definition than commonly used, where the result is be the identity matrix, i.e. having diagonal values equal to 1. Matrix M may be normalized to satisfy the stronger conventional orthogonality requirement, but as will subsequently be described such normalization is neither necessary nor desirable in practice.

Functionally, orthogonality requires that the vector of weights in a row representing a multi-input comparator be orthogonal to all other rows, and that each row representing a multi-input comparator sums to zero (since it is orthogonal to the common mode all 1's codeword). As this implies the comparator outputs are also orthogonal (and therefore independent,) they represent distinct communications modes, herein described as "sub-channels" of the Vector Signaling Code communications system.

Given this modal interpretation, the initial row of the matrix may be seen to represent the common-mode communications channel over the transmission medium. As it is desirable in a practical system for the receiver to have common-mode rejection, the first row is set to all "1" values, maximizing the common mode contribution of each wire input to this one matrix row. As by definition all rows of the matrix are orthogonal, it follows that no other matrix row (i.e. no receiver output) may then be impacted by common mode signals. Embodiments having such common mode rejection need not implement a physical comparator corresponding to the first row of their descriptive matrix.

For avoidance of confusion, it is noted that all data communications in an ODVS system, including the state changes representing signals carried in sub-channels, are communicated as codewords over the entire channel. An embodiment may associate particular mappings of input values to codewords and correlate those mappings with particular detector results, as taught herein and by [Holden I] and [Ulrich I], but those correlations should not be confused with partitions, sub-divisions, or sub-channels of the physical communications medium itself. Similarly, the concept of ODVS sub-channels is not limited by the example embodiment to a particular ODVS code, transmitter embodiment, or receiver embodiment. Encoders and/or decoders maintaining internal state may also be components of some embodiments. Sub-channels may be represented by individual signals, or by states communicated by multiple signals.

Generating ODVS Codes Corresponding to a Receiver Matrix

As described in [Cronie I] and [Cronie II], an Orthogonal Differential Vector Signaling code may be constructed from a generator matrix by multiplication of an input modulation vector of the form $(0, a_1, a_2, \ldots a_n)$ by the matrix M. In the simplest case, each $a_i$ of this vector is the positive or negative of a single value, as example ±1, representing one bit of transmitted information.

Given the understanding of M as describing the various communications modes of the system, it may readily be seen that multiplication of the matrix by such an input vector comprises excitation of the various modes by the $a_i$, of that vector, with the zeroth mode corresponding to common mode transmission not being excited at all. It will be obvious to one familiar with the art that transmission energy emitted in the common mode is both unnecessary and wasteful in most embodiments. However, in at least one embodiment, a nonzero amplitude for the common mode term is used to provide a nonzero bias or baseline value across the communications channel.

It also may be seen that the various codewords of the code generated using this method represent linear combinations of the various orthogonal communication modes. Without additional constraints being imposed (e.g., for purposes of implementation expediency,) this method results in systems capable of communicating N−1 distinct sub-channels over N wires, typically embodied as a N−1 bit/N wire system. The set of discrete codeword values needed to represent the encoded values is called the alphabet of the code, and the number of such discrete alphabet values is its alphabet size.

As a further example, the code generated by this method from the matrix of Eqn. 4 is shown in Table 1.

TABLE 1

| | |
|---|---|
| ±[1, 1/3, −1/3, −1, −1/3, 1/3] | ±[1, 1/3, −1/3, 1/3, −1, −1/3] |
| ±[1/3, 1, −1/3, −1, −1/3, 1/3] | ±[1/3, 1, −1/3, 1/3, −1, −1/3] |
| ±[1/3, −1/3, 1, −1, −1/3, 1/3] | ±[1/3, −1/3, 1, 1/3, −1, −1/3] |
| ±[−1/3, 1/3, 1, −1, −1/3, 1/3] | ±[−1/3, 1/3, 1, 1/3, −1, −1/3] |
| ±[1, 1/3, −1/3, −1, 1/3, −1/3] | ±[1, 1/3, −1/3, 1/3, −1/3, −1] |
| ±[1/3, 1, −1/3, −1, 1/3, −1/3] | ±[1/3, 1, −1/3, 1/3, −1/3, −1] |
| ±[1/3, −1/3, 1, −1, 1/3, −1/3] | ±[1/3, −1/3, 1, 1/3, −1/3, −1] |
| ±[−1/3, 1/3, 1, −1, 1/3, −1/3] | ±[−1/3, 1/3, 1, 1/3, −1/3, −1] |

As may be readily observed, the alphabet of this code consists of the values +1, +⅓, −⅓, −1, thus this is a quaternary code (e.g. having an alphabet size of four.) This code will subsequently be described herein as the 5b6w or "Glasswing" code, and its corresponding receive matrix of Eqn. 4 as the "Glasswing receiver".

Figure 4:
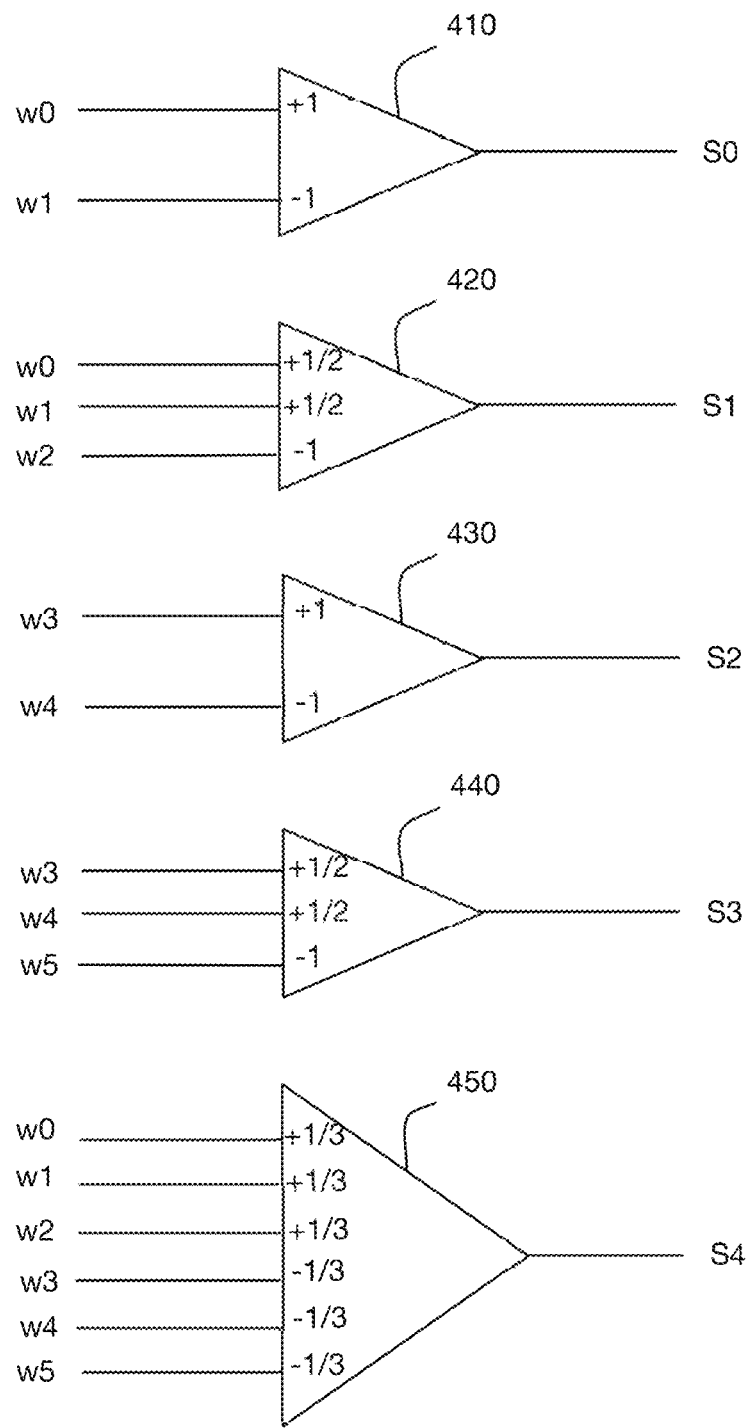
FIG. 4 is a block diagram of a Glasswing receiver, in accordance with some embodiments.

An embodiment of the Glasswing receiver as defined by the matrix of Eqn. 4 is shown in FIG. 4. The six input wires are $w_0$ through $w_5$, and the five sub-channel outputs are $S_0$ through $S_5$. In the drawing convention used here, each of the inputs of the multiple-input comparators 410 through 450 are identified by a weight, representing the relative contribution of that input to the final result output, as defined by the matrix rows of Eqn. 4 defining each MIC. Thus, 410 and 430 may be seen to be conventional dual input differential comparators, each having one positive and one negative input of equal and opposite weight. Comparators 420 and 440 each have two positive inputs each contributing one half to the total positive value, and one input contributing the entire negative value. Comparator 450 has three inputs each contributing one third to the total positive value, and three inputs each contributing one third to the total negative value. Although the 5 subchannel outputs S0-S4 are denoted with a single line, it should be noted that in many embodiments, each subchannel output may be a differential output.

Figure 5:
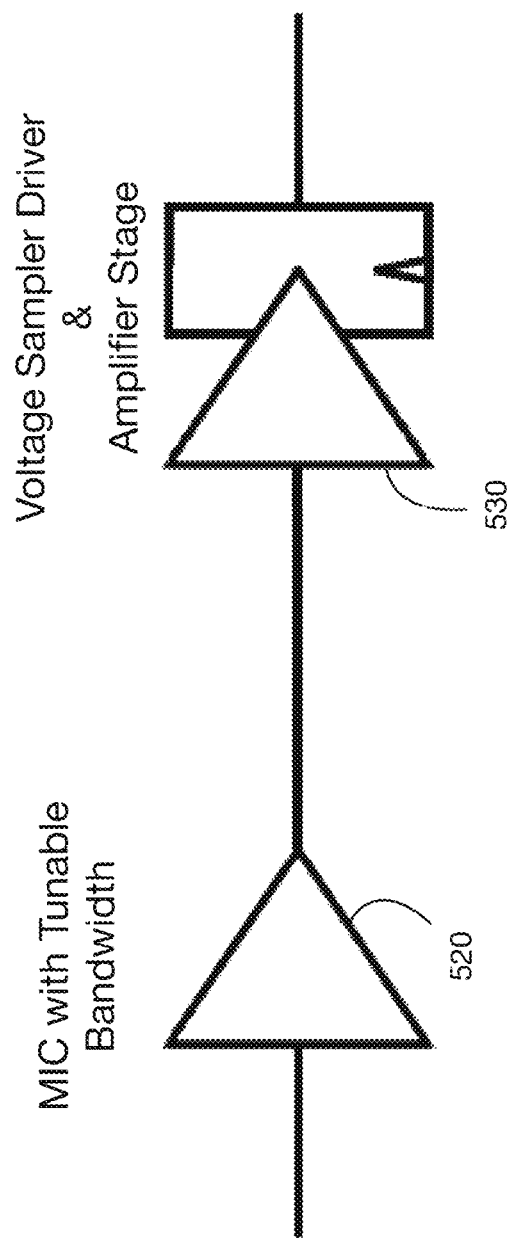
FIG. 5 is a block diagram of a MIC with tunable bandwidth (BW) connected to a voltage sampler driver and amplifier stage, in accordance with some embodiments.

FIG. 5 depicts a block diagram of an embodiment using a BW-tunable MIC 520, connected to a voltage sampler driver and amplifier stage (also referred to as the sampler/equalizer) 530, in accordance with some embodiments. Such a design offers various advantages. First, conventionally, the DC gain of a CTLE is adjusted to achieve the desired equalization. In the apparatus shown in FIG. 5, power dissipation of the CTLE remains fixed even if the channel characteristics are good. The sampler/equalizer circuit provides a degree of freedom such that the apparatus may consume less power when the channel characteristics are good. In some embodiments, both equalization and power dissipation may be calibrated based on channel loss. This is something very challenging to do with the conventional architectures. That is, in conventional architectures, an extra CTLE stage may need to be switched in/out based on the particular channel response, which may be challenging. Architectures described herein that utilize a separate BW-tunable MIC 520 provide adjustable power dissipation and equalization in a straightforward manner. In some embodiments, an architecture comprises a BW-tunable MIC 520 followed by the proposed equalizer/sampler 530. In some embodiments, tuning the BW of a CTLE or MIC includes adjusting the frequency-selective impedance and the magnitude of the tail source current. In some embodiments, calibrating the equalization includes adjusting the BW of the MIC without touching the equalizer/sampler stage. When less equalization is needed, BW (and hence the bias current) can be reduced, resulting in less power consumption. When the BW of the MIC is reduced, the effective peaking of the path (MIC/equalizer/sampler) is also reduced, providing tunable equalization.

Figure 13:
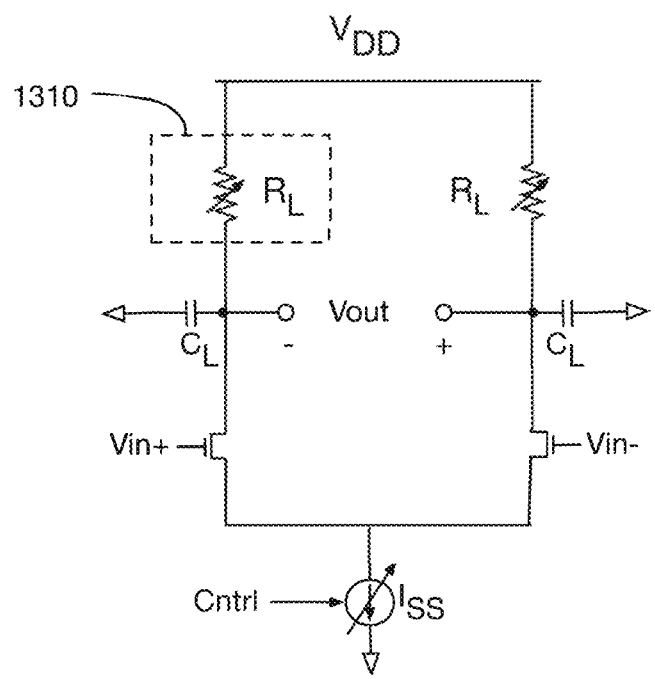
FIG. 13 depicts an amplifier with tunable bandwidth (BW), in accordance with some embodiments.

FIG. 13 depicts a schematic of an amplifier with a tunable BW. As shown, the amplifier includes tunable load impedances 1310 ($R_L$), a load capacitor CL a tunable current source $I_{SS}$. As will be apparent to one of skill in the art, the BW of the amplifier shown in FIG. 13 is shown in Eqn. 5:

$$BW = \frac{1}{2\pi R_L C_L} \qquad \text{(Eqn. 5)}$$

Figure 14:
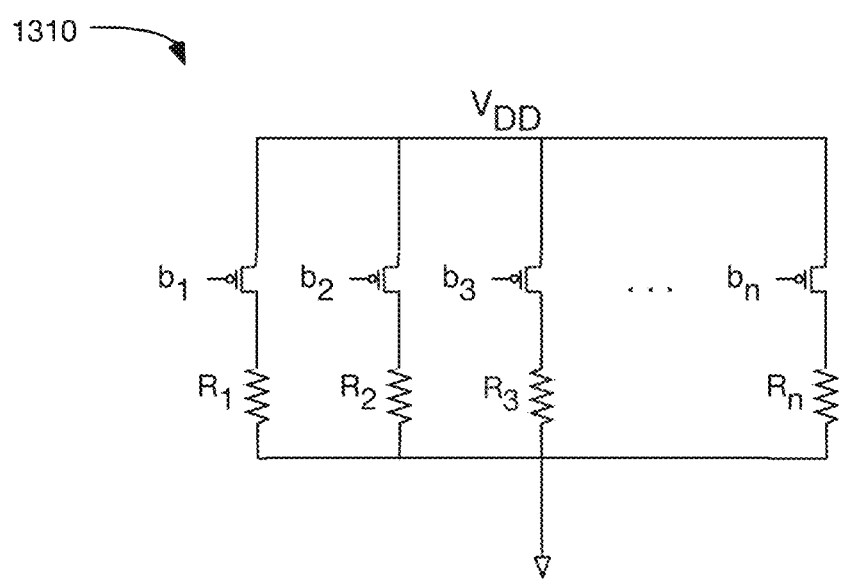
FIG. 14 depicts a tunable impedance, in accordance with some embodiments.

To adjust the BW of the amplifier shown in FIG. 13, $R_L \cdot I_{SS}$ may be fixed, and the BW may be adjusted by changing $R_L$ and $I_{SS}$ inversely (i.e. as $R_L$ is increased, $I_{SS}$ is decreased, and vice versa). This will keep the gain constant while tuning BW. In such embodiments, power consumption may be adjusted. A low power consumption amplifier may be designed by increasing $R_L$ while decreasing $I_{SS}$, at the cost of a reduced BW. An example schematic of a possible tunable $R_L$ is shown in FIG. 14. As shown, FIG. 14 includes multiple resistors $R_1$, $R_2$, $R_3$, in parallel, each having a series-connected PMOS FETs. In some embodiments, the values of each resistor may be equal, however this should not be considered limiting. In FIG. 14, each PMOS receives a corresponding gate input that may connect the corresponding resistor to the $V_{DD}$ common node. As will be apparent to one of skill in the art, increasing parallel resistance will lower the overall resistance of the circuit. In order to increase resistance, the control signals may be configured (e.g., via a register) to disconnect one or more resistors from the $V_{DD}$ common node. In some embodiments, known resistance values for given combinations of the control signals may be known, and using firmware or a look-up table (LUT), the controls can be provided to the PMOS devices based on a desired load resistance. In some embodiments (constant power embodiments), the same controls may be used in inversely controlling the magnitude of the tunable current source. It should be noted that the differential amplifier configuration is in no way limiting, and that such configurations would work with MICs as well (such as the MICs of FIGS. 3A and 3B, or the MIC with tunable BW 520 shown in FIG. 5). Further, in alternative embodiments, tunable load impedance 1310 does not have to have the configuration shown in FIG. 14, as tunable load impedance 1310 may include a potentiometer, or any other tunable impedance elements known to those of skill in the art. In other alternative embodiments, it may be feasible that the load capacitor CL is tunable to provide additional BW tuning while keeping power consumption constant. It should be noted that the amplifier with tunable BW shown in FIG. 13 is depicted as a differential amplifier, however in some embodiments, the same principles may be implemented in a MIC (such as those depicted in FIGS. 3A and 3B) to create BW-tunable MIC 520.

Figure 6:
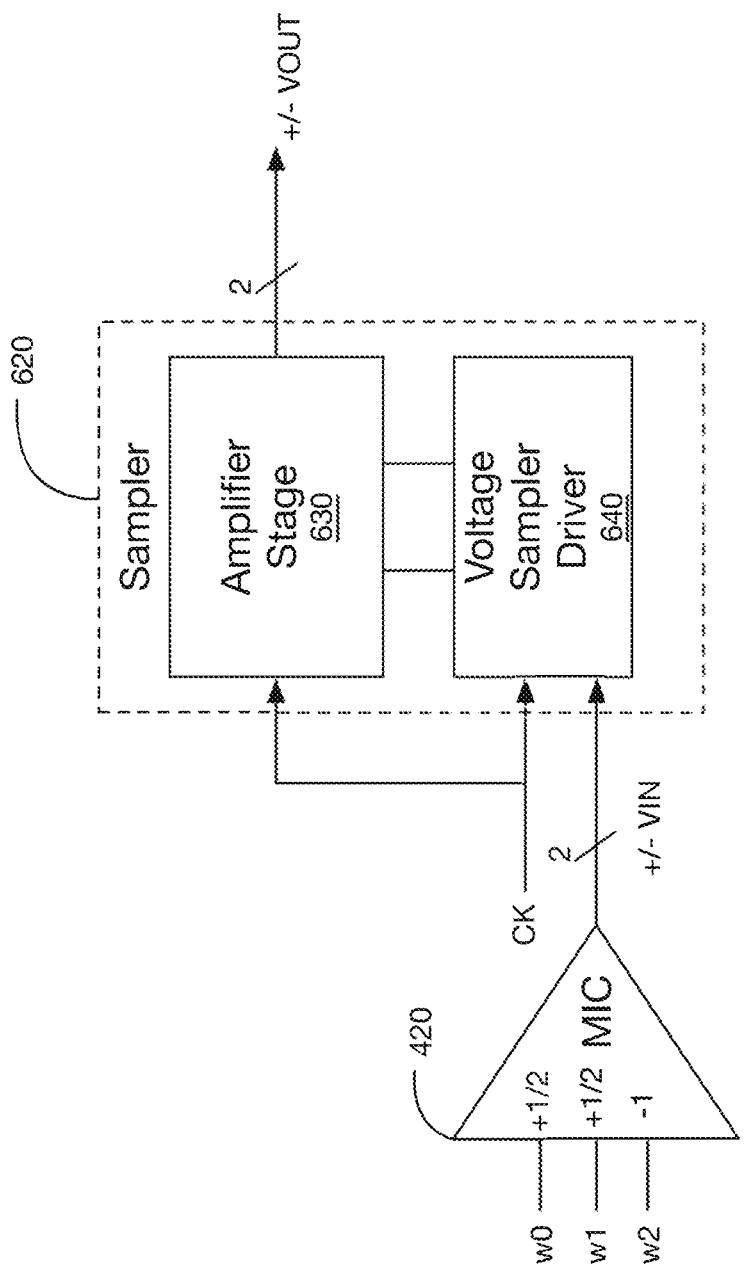
FIG. 6 is an alternative block diagram of a MIC connected to a voltage sampler driver and amplifier stage, in accordance with some embodiments.
Figure 15:
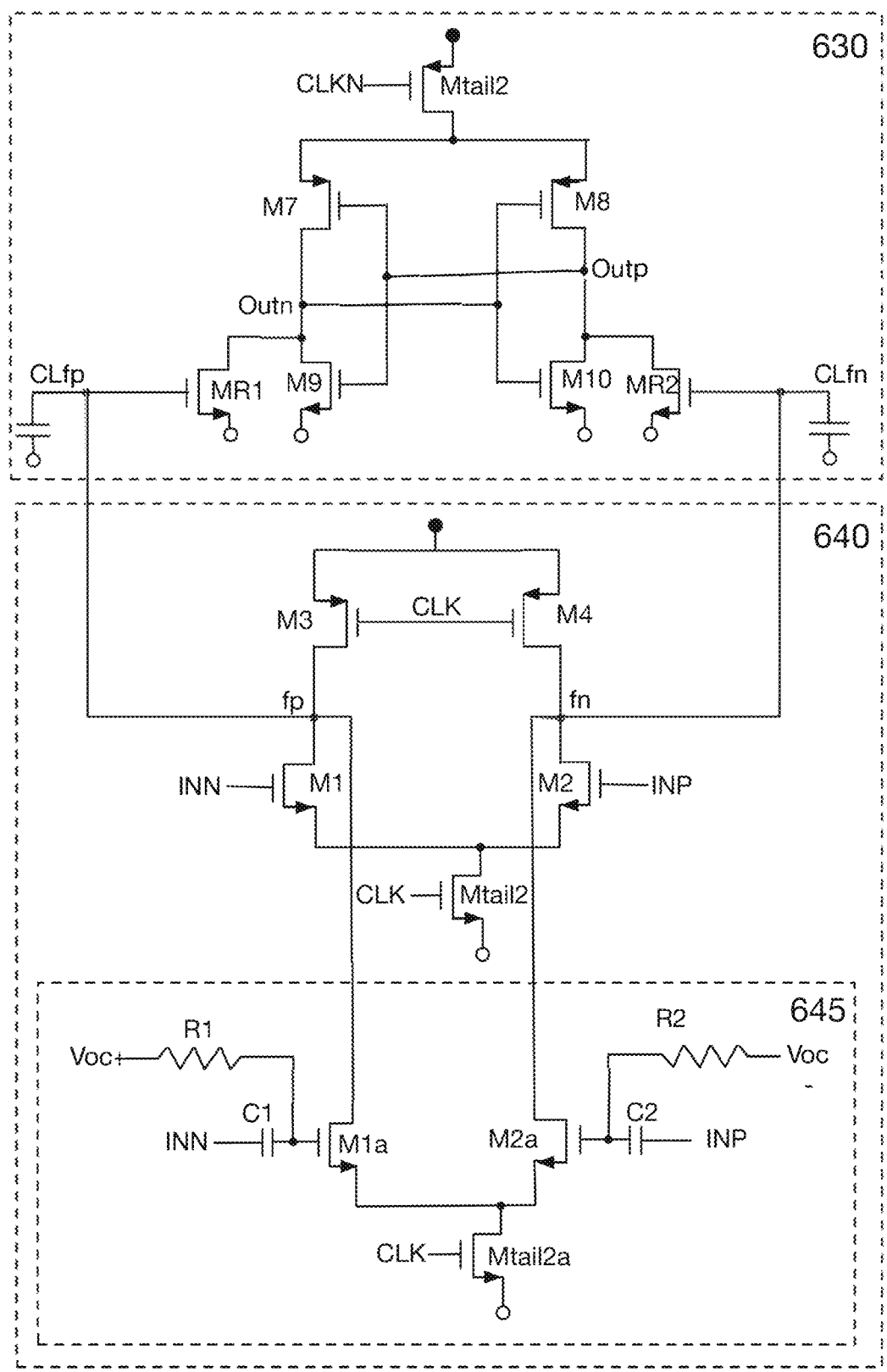
FIG. 15 depicts a voltage sampler driver connected to a double-tail latch, in accordance with some embodiments.
Figure 16:
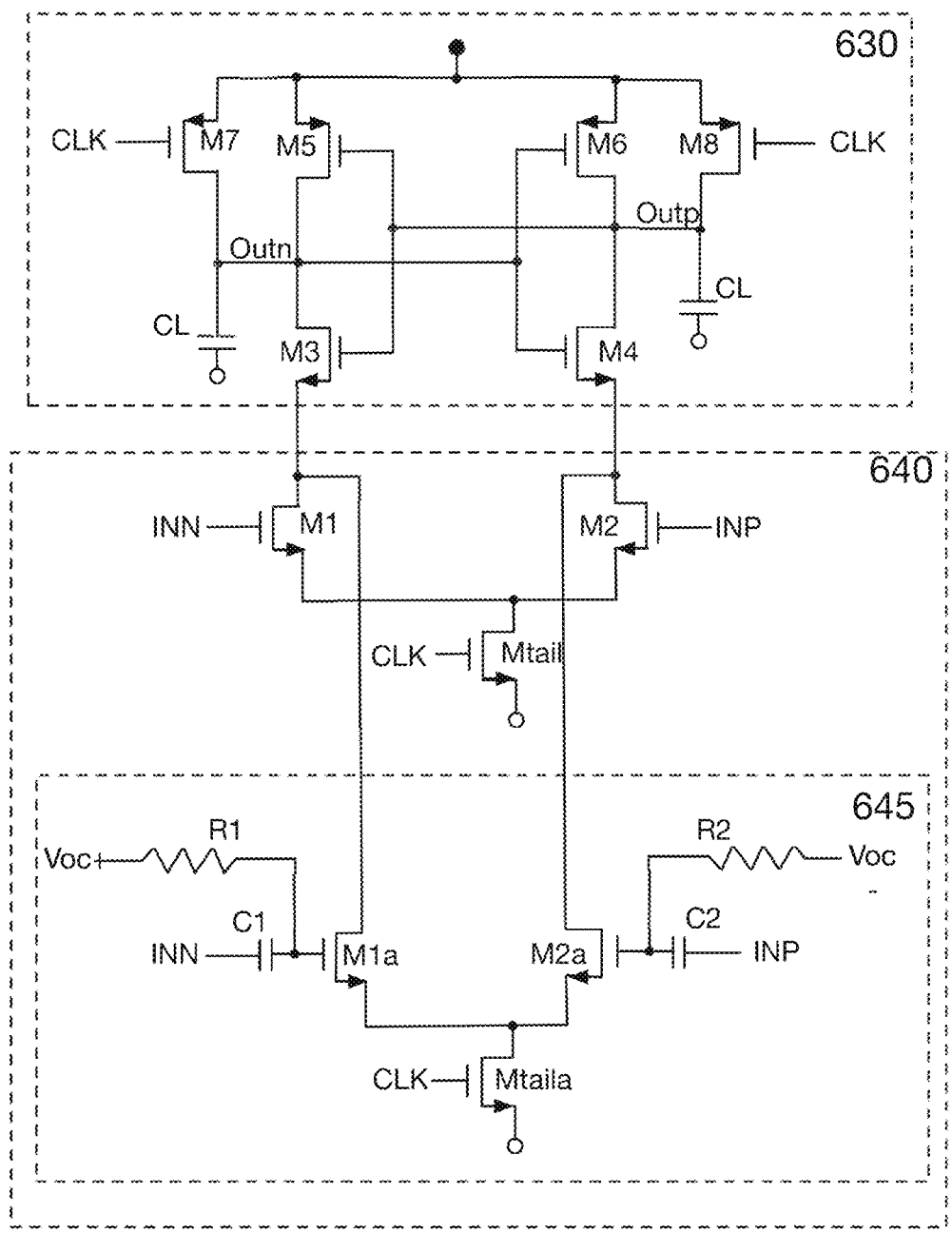
FIG. 16 depicts a voltage sampler driver connected to a StrongARM latch, in accordance with some embodiments.

FIG. 6 depicts block diagram including sampler 620, which includes amplifier stage 630 and voltage sampler driver 640. As shown, MIC 420 receives a set of input signals w0-w2. MIC 420 provides a differential voltage +/−VIN to voltage sampler driver 640. In some embodiments, voltage sampler driver also receives a clock signal in order to periodically enable the voltage sampler driver. In some embodiments, the voltage sampler driver 640 is configured to draw a differential current through amplifier stage 630. In some embodiments, amplifier stage 630 includes an integrator with positive feedback. In some embodiments, amplifier stage 630 may include a double-tail latch, as shown in FIG. 15. In some embodiments, amplifier stage 630 may include a StrongARM latch, as shown in FIG. 16. As described by [Razavi], the StrongARM latch operates in three phases. In the first phase, the CLK signal is low, the capacitances CL at nodes Outn, Outp, and the capacitances of M1 and M2 are charged to VDD. In the second phase, CLK goes high, and current begins flowing through transistors M1 and M2, and the capacitances of M1 and M2 begin discharging. The current flowing through the transistors (and therefore the speed at which the capacitances of M1 and M2 discharge) is proportional to the inputs INN and INP. In the third phase, as the capacitances of M1 and M2 discharge, the cross-coupled transistors M3 and M4 turn on and CL at nodes Outn and Outp begin to discharge as current through M3 and M4. As one of the CL's discharges faster, either PMOS' M7 and M5 will turn on (if Outp discharges faster) or PMOS' M6 and M8 will discharge (if Outn discharges faster), charging their respective nodes back to VDD, which will increase the rate at which current discharges through the corresponding cross-coupled NMOS M4/M3, respectively. This causes a cascading latch effect to drive Outn and Outp in opposite directions, and the speed at which this process occurs is directly proportional to inputs INN and INP. Thus, for embodiments herein that inject high-pass filtered content into the inputs INN and INP, the process occurs faster. FIG. 16 also includes an offset correction differential pair 645 with high-frequency injection connected in parallel to the input differential pair. A similar configuration is shown in FIG. 15. In some embodiments, voltage sampler driver 640 is configured to draw differential current through the integrator in order to provide a differential voltage output +/−VOUT. In some embodiments, amplifier stage 630 includes load resistors to provide the differential output voltage.

Figure 7:
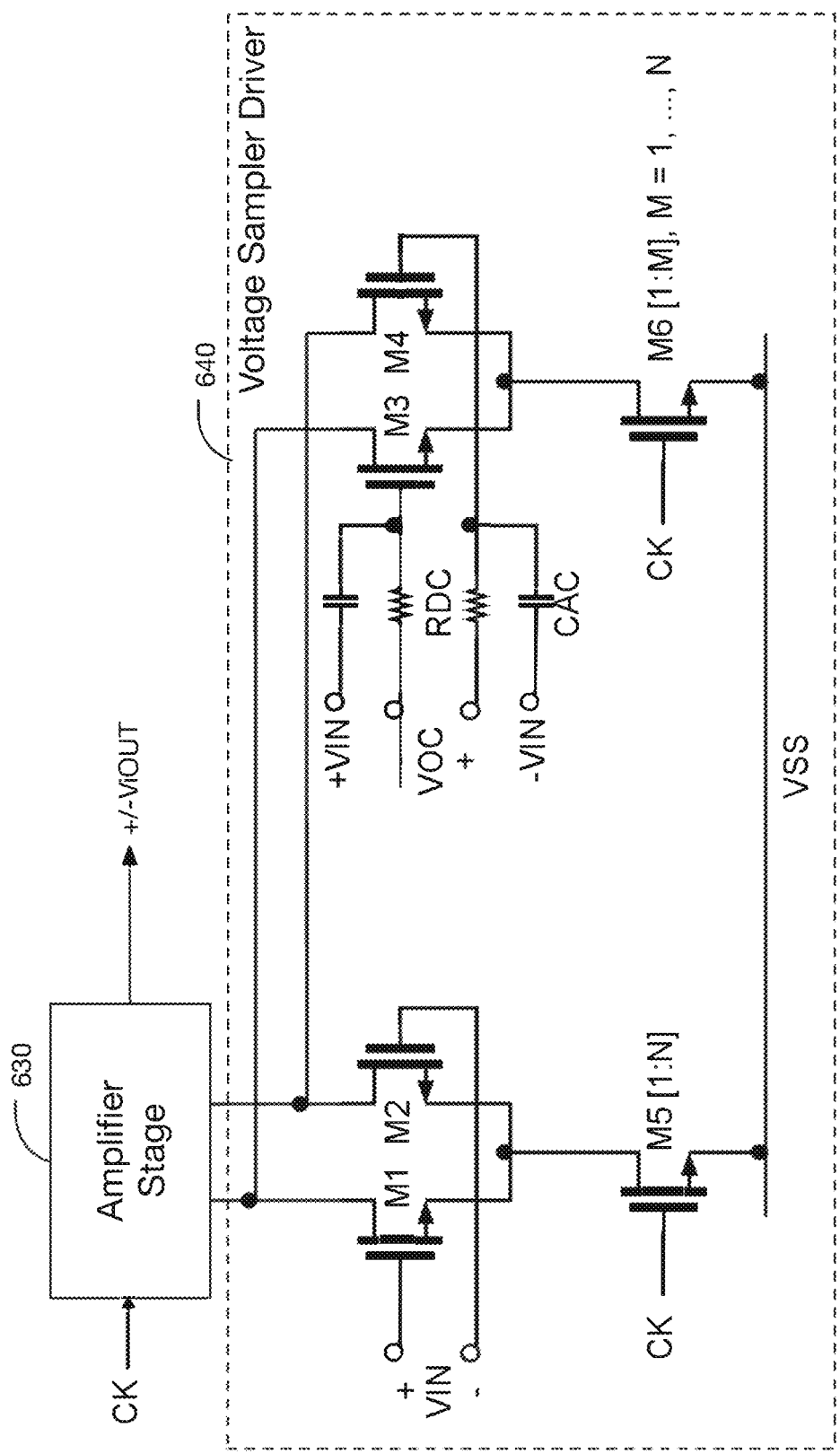
FIG. 7 is a schematic of the voltage sampler driver, in accordance with some embodiments.

FIG. 7 depicts a diagram of an apparatus, in accordance with some embodiments. As shown, the apparatus includes voltage sampler driver 640 configured to generate an output differential current from at least a first differential current and a second differential current, the voltage sampler driver including an input differential branch pair configured to receive a set of input signals+/−VIN, each branch of the differential branch pair including one or more transistors for generating the first differential current. The voltage sampler driver 640 further includes an offset voltage branch pair configured to receive an offset voltage control signal+/−VOC, each branch of the offset differential branch pair including one or more transistors for generating the second differential current. The apparatus of FIG. 7 also includes an amplifier stage 630 connected to the voltage sampler driver 640, the amplifier stage 630 configured to generate a differential output voltage +/−VOUT based on the output differential current drawn by periodically enabling the input differential branch pair and the offset differential branch pair. The apparatus further includes a high-pass filter for supplementing a high-frequency component of the second differential current by injecting a high-pass filtered version of the set of input signals via the offset differential branch pair. In some embodiments, the input differential branch pair and the offset differential branch pair are periodically enabled using respective tail current sources (shown as transistors). In some embodiments, the tail current sources are enabled using an input clock signal CK. In some embodiments, the magnitude of the current drawn through the respective tail current sources is independently tunable (by adjusting transistor characteristics, etc.) to allow tuning the frequency-peaking characteristics of the sampler. The presence of the offset differential branch pair facilitates input offset compensation versus, as one example, the capacitive trimming performed to provide offset correction in the latch of [Razavi]. Utilization of the offset differential branch pair to provide additional high-frequency gain further distinguishes such embodiments. In addition, the current ratio between input differential pairs and the offset correction pair can be adjusted to change the DC gain while high frequency gain remains unchanged.

Figure 8:
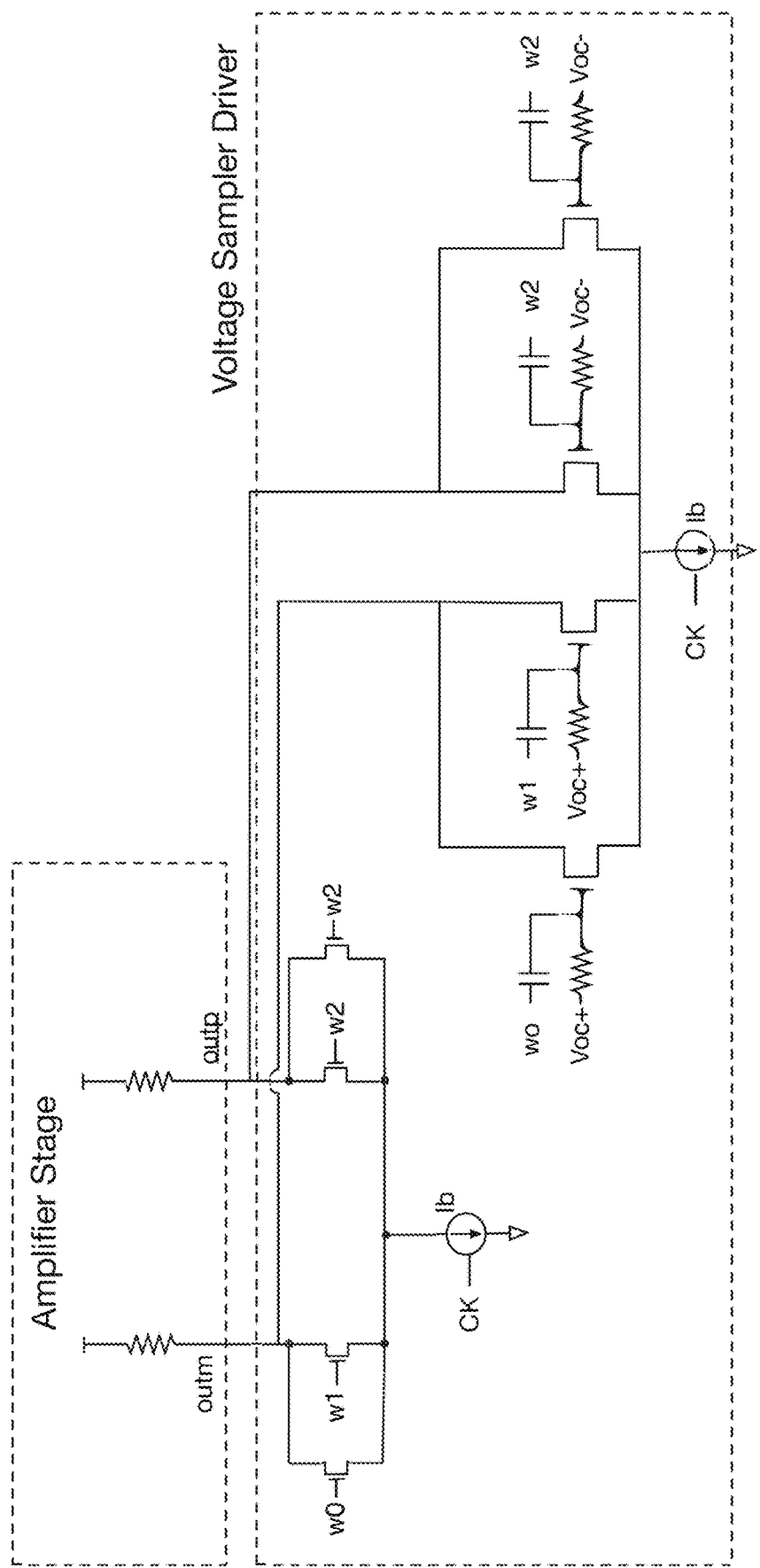
FIG. 8 is a schematic of a multi-input voltage-sampler driver, in accordance with some embodiments.

In some embodiments, the offset differential branch pair may be incorporated into a MIC, as shown in FIG. 8. In one embodiment, the set of input signals received by the input differential branch pair of the MIC correspond to symbols of a codeword of a vector signaling code. As shown, a first branch of the input differential branch pair receives symbols on wires w0 and w1, while a second branch of the input differential branch pair receives symbols on wire w2. In some embodiments, as shown, the offset differential branch pair includes a same transistor configuration as the input differential branch pair. In some embodiments, the input differential branch pair and the offset differential branch pair each comprises a pair of transistors. In some embodiments, the input differential branch pair and the offset differential branch pair each include one or more transistors. In some embodiments, each input signal in the input differential branch pair and the offset differential branch pair have weights applied to them (as shown in FIGS. 2A and 2B). In some embodiments, the weights are selected according to a row of an orthogonal matrix (e.g., in FIG. 8, the weights correspond to row 3 of Eqn. 4). In some embodiments, the weight of a given input signal is determined by a number of identical transistors receiving the same input signal (e.g., a weight of 2 as shown in FIG. 8 is represented as two identical transistors, each receiving w2 as an input). In some embodiments, the weight applied to a given input signal is determined by a single transistor having an input weighting factor associated with it. In some embodiments, the input weighting factor may be determined by transistor characteristics.

Figure 9:
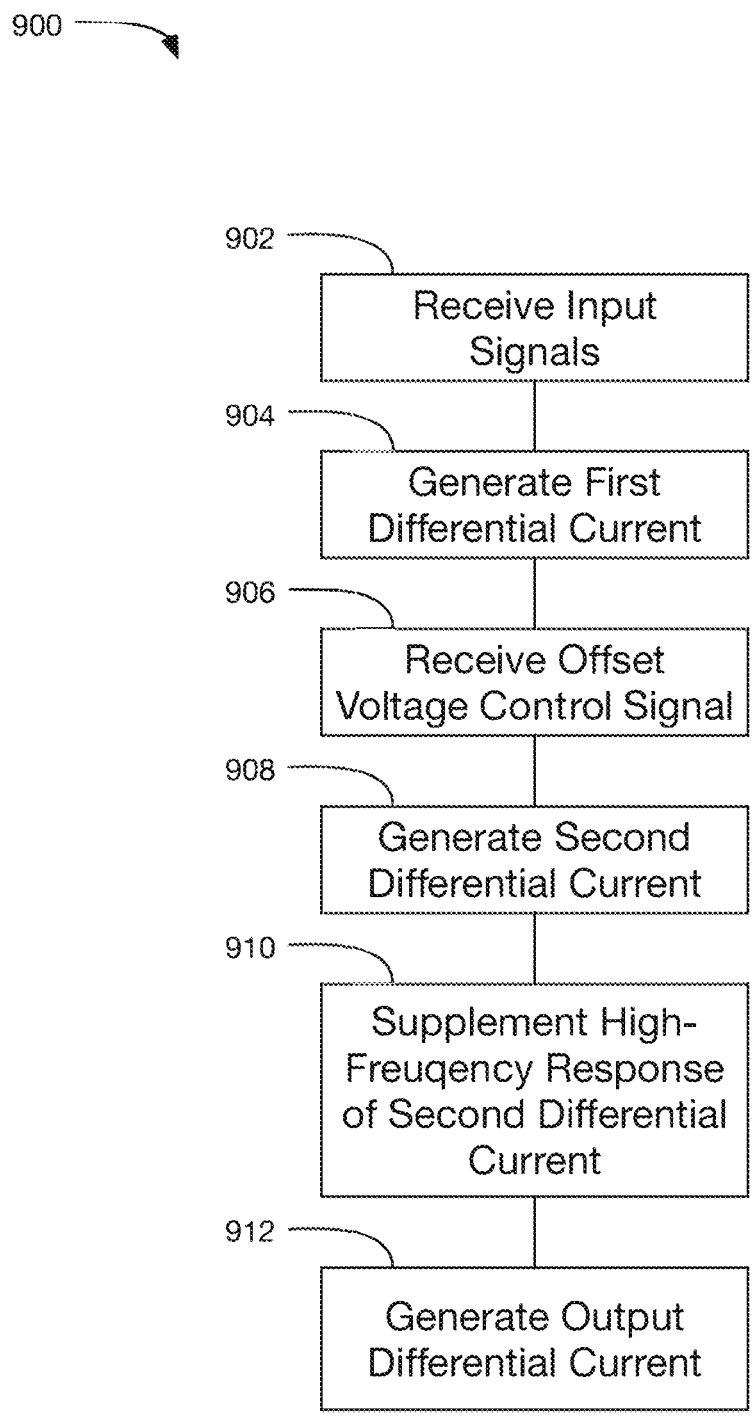
FIG. 9 is a flowchart of a process, in accordance with some embodiments.

FIG. 9 depicts a method 900, in accordance with some embodiments. As shown, method 900 includes receiving, at step 902, a set of input signals at an input differential branch pair, and responsively generating a first differential current at step 904. At step 906, an offset voltage branch pair receives an offset voltage control signal at an input, and responsively generates a second differential current at step 908. At step 910, a high-pass filter supplements a high-frequency component of the second differential current by injecting a high-pass filtered version of the set of input signals into the input of the offset voltage branch pair. At step 912, an amplifier stage connected to the input differential branch pair and the offset voltage branch pair generates an output differential current based on the first and second differential currents. It should be noted that the steps in FIG. 9 are not in any particular order, and that some steps may occur simultaneously. For example, the first and second currents may be generated simultaneously by receiving the set of input signals at the input differential branch pair, and simultaneously receiving the offset voltage control signal and high-frequency version of the input signals at the input of the offset voltage branch pair. The first and second differential currents are then in effect superimposed on each other to form the output differential current.

In some embodiments, generating the first and second differential currents includes enabling corresponding tail current sources for the input differential branch pair and the offset differential branch pair. In some embodiments, the method further includes periodically enabling the respective tail current sources using an input clock signal.

In some embodiments, the method further includes generating a differential output voltage by drawing the output differential current through a pair of load resistors. In some embodiments, each load resistor has a corresponding capacitor connected between one terminal of the load resistor and ground. In some embodiments, the load resistors are tunable. In some embodiments, the amplifier stage further comprises an adjustable current tail source.

In some embodiments, a product of a current magnitude of the adjustable current tail source and an impedance magnitude of one of the load resistors is constant, and the method further includes adjusting the pair of load resistors and the tunable current source to adjust bandwidth. Alternatively, a product of a current magnitude of the tunable current tail source and an impedance magnitude of one of the load resistors is not constant, and the method further includes adjusting the pair of load resistors and the current source to adjust power consumption.

In some embodiments, each tunable load resistor comprises a plurality of resistors in a parallel network, and the method further includes selectably enabling each resistor of the plurality of resistors according to a corresponding switch receiving a corresponding control signal.

Figure 10:
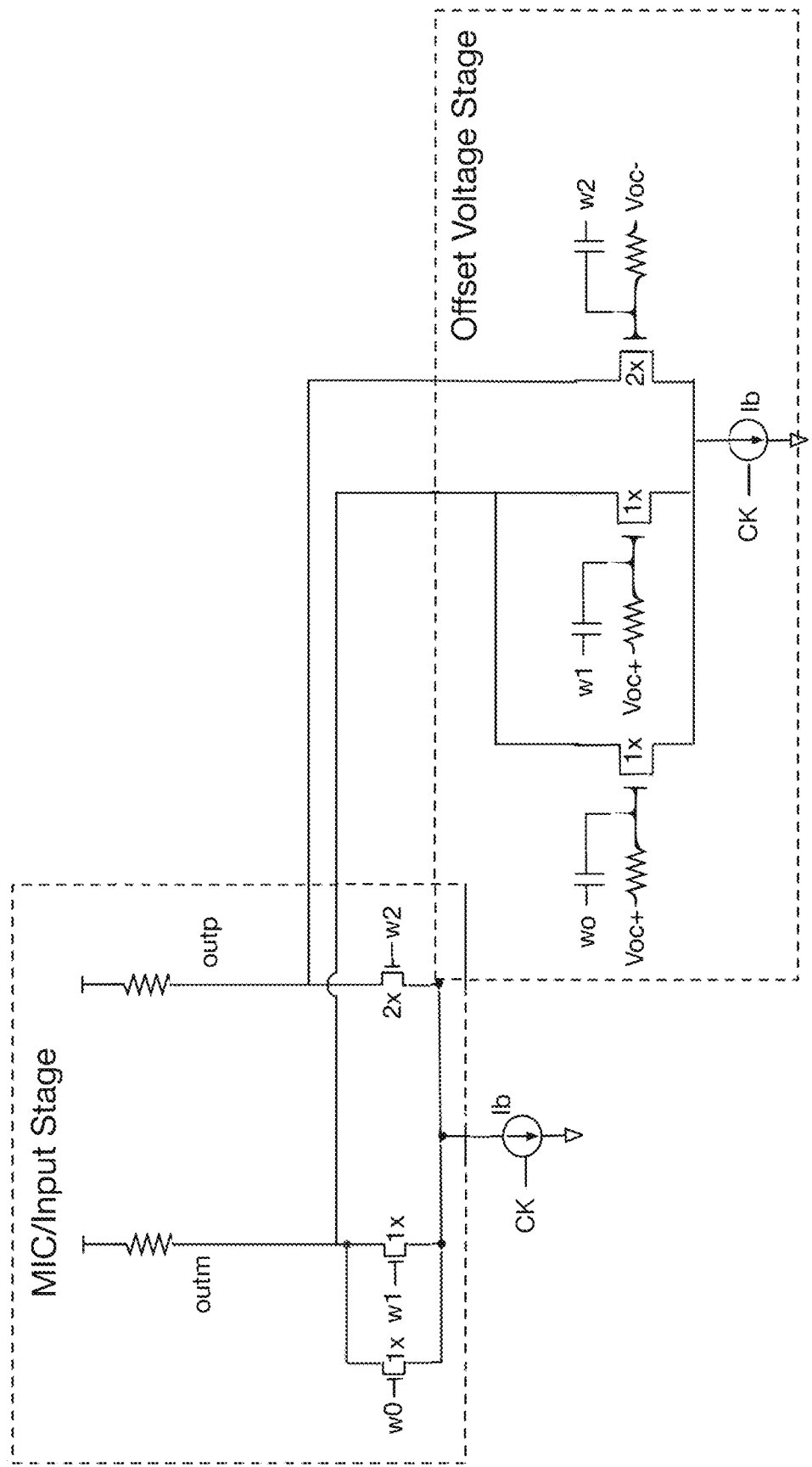
FIG. 10 depicts a first configuration of a MIC/Offset correction combination circuit, in accordance with some embodiments.

FIG. 10 depicts an example configuration (similar to FIG. 8) of a MIC/Offset voltage correction combination. As shown, FIG. 10 includes a MIC/Input stage and an Offset Voltage Stage. The MIC/Input stage includes transistors (shown with input weighting factors for simplicity, however this is not limiting), load impedances and a current source with a clock (CK) input. FIG. 10 also includes an offset voltage stage similar to the offset voltage stage on the right side of FIG. 7, however there are more than two inputs entering the offset voltage stage. The offset voltage stage shown in FIG. 10 is utilizing a similar advantage shown in the MIC/Input stage of having a single transistor on the right side with a 2x input weighting factor/coefficient. In some embodiments, the transistor input weighting factor is implemented by adjusting physical characteristics of the transistor (e.g., channel width). In alternative embodiments, the input weighting factor is implemented using a number of identical transistors in parallel, each transistor in parallel receiving the same input.

Figure 11:
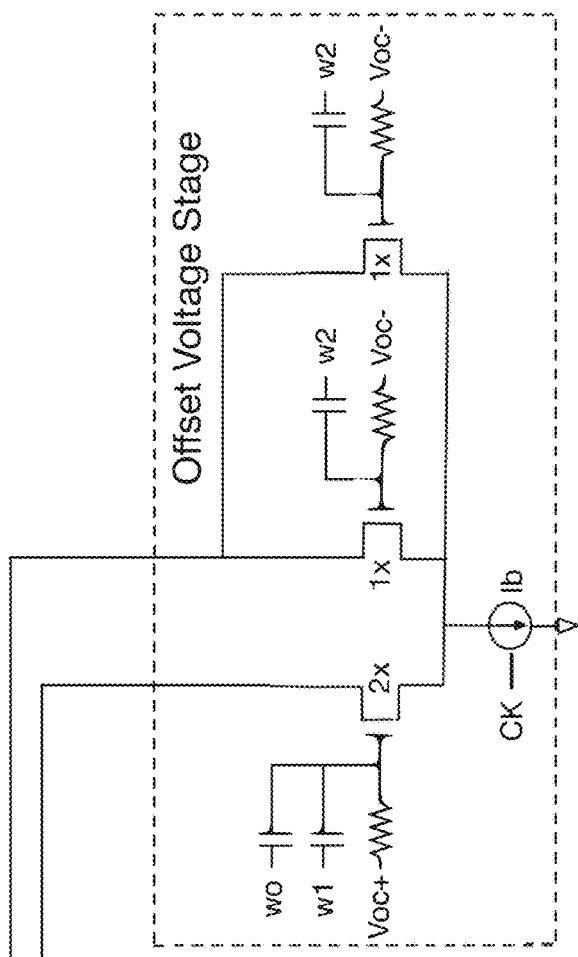
FIG. 11 depicts a second configuration of a MIC/Offset correction combination circuit, in accordance with some embodiments.
Figure 11:
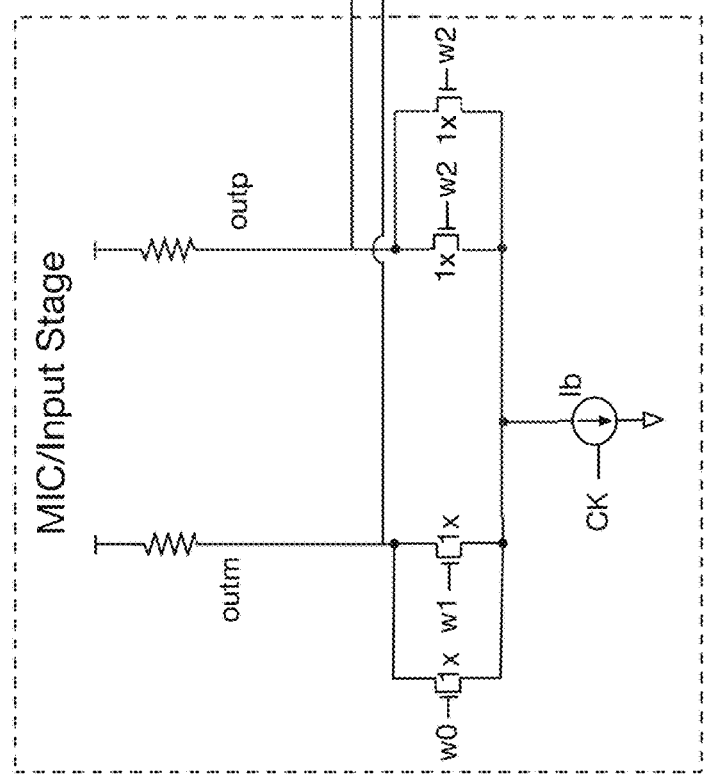

FIG. 11 depicts a similar embodiment to that of FIG. 10, however the left side of the offset voltage stage is sharing a transistor with a 2x input weighting factor, and the transistor is receiving high frequency content of signals w0 and w1. In some embodiments, the embodiments shown in FIGS. 10 and 11 may be chosen based on design parameters such as device matching (e.g., parasitic input caps and physical caps).

Figure 12:
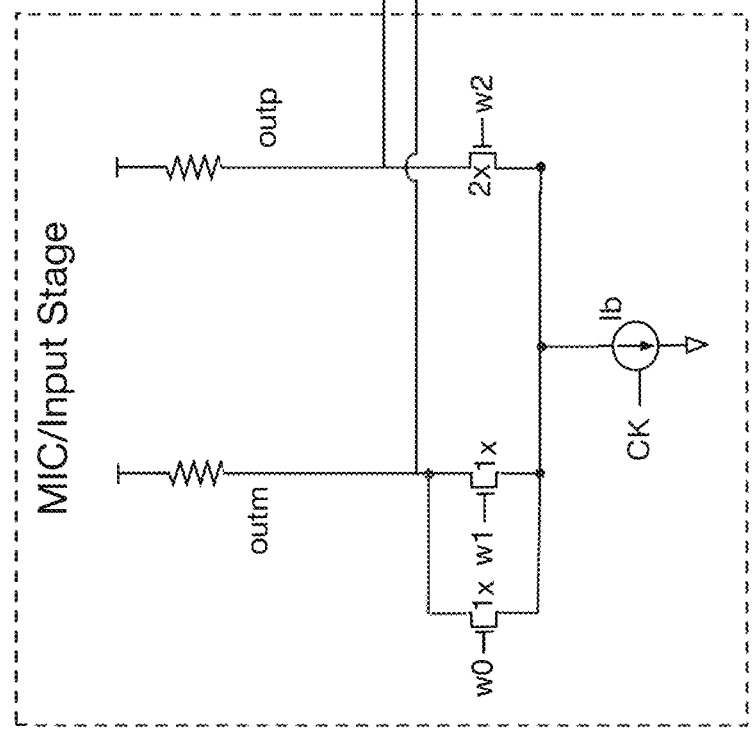
FIG. 12 depicts a third configuration of a MIC/Offset correction combination circuit, in accordance with some embodiments.
Figure 12:
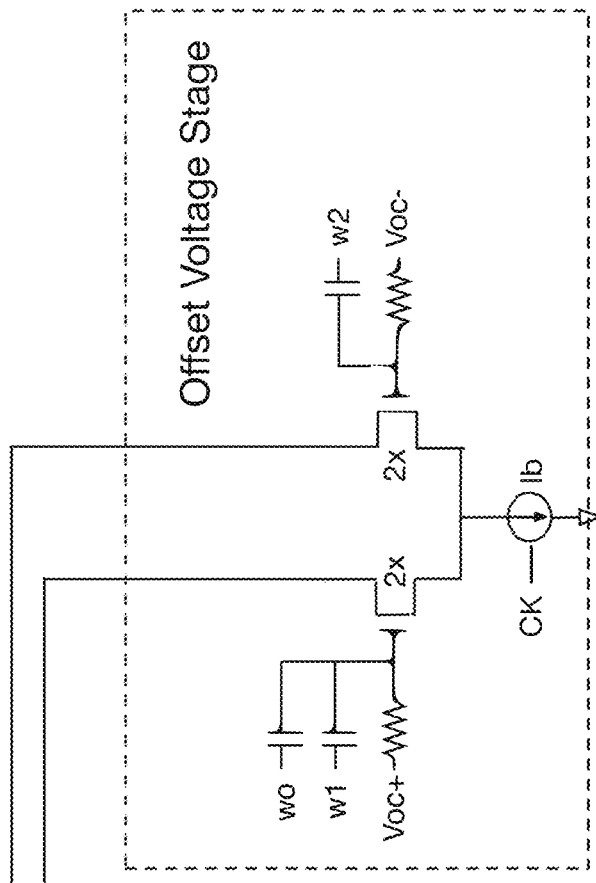

FIG. 12 depicts a combination of the embodiments shown in FIGS. 10 and 11, which may provide an advantage of having a smaller number of transistors. The embodiments shown in FIGS. 10, 11 and 12 depict MICs without any equalization or tunable bandwidth, however it should be noted that the EQ technique shown in FIG. 3A and BW tuning technique shown in FIGS. 13 and 14 may be utilized in any of the embodiments shown in FIGS. 10, 11 and 12.

Figure 17:
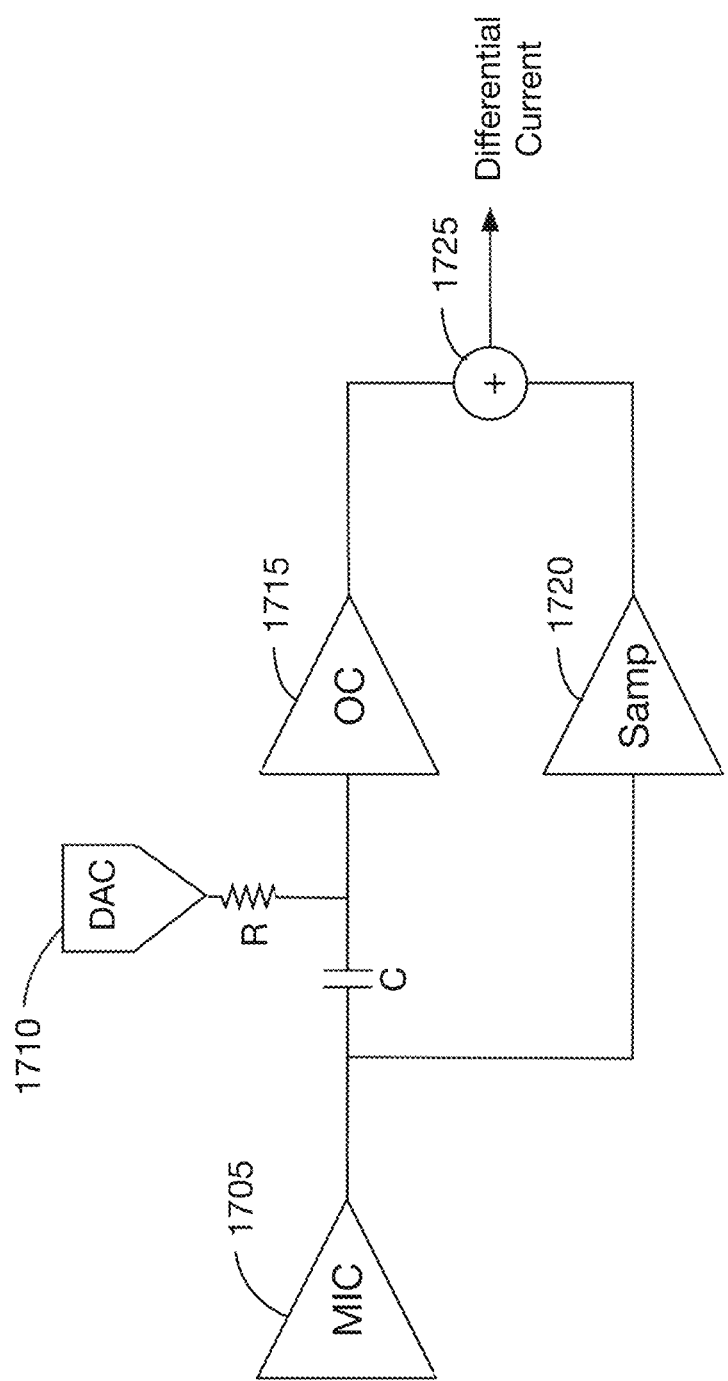
FIG. 17 depicts a schematic in accordance with some embodiments.

FIG. 17 depicts a schematic in accordance with some embodiments. As shown, the circuit includes a MIC 1705, a DAC (to provide an offset correction voltage) 1710, an RC network, an offset correction pair 1715, an input differential pair 1720, and a summation node 1725. MIC 1705 may take the form of MICs described above. In some embodiments, the RC network corresponds to the RC network of FIG. 7 to inject a high-pass filtered version of the MIC output into the differential current. The input differential pair 1720 (also referred to as the sampler differential pair) is configured to receive the differential output of MIC 1705. In some embodiments, summation node corresponds to a junction of wires in order to provide a summation of currents from input differential pair 1720 and offset correction differential pair 1715.

Figure 18:
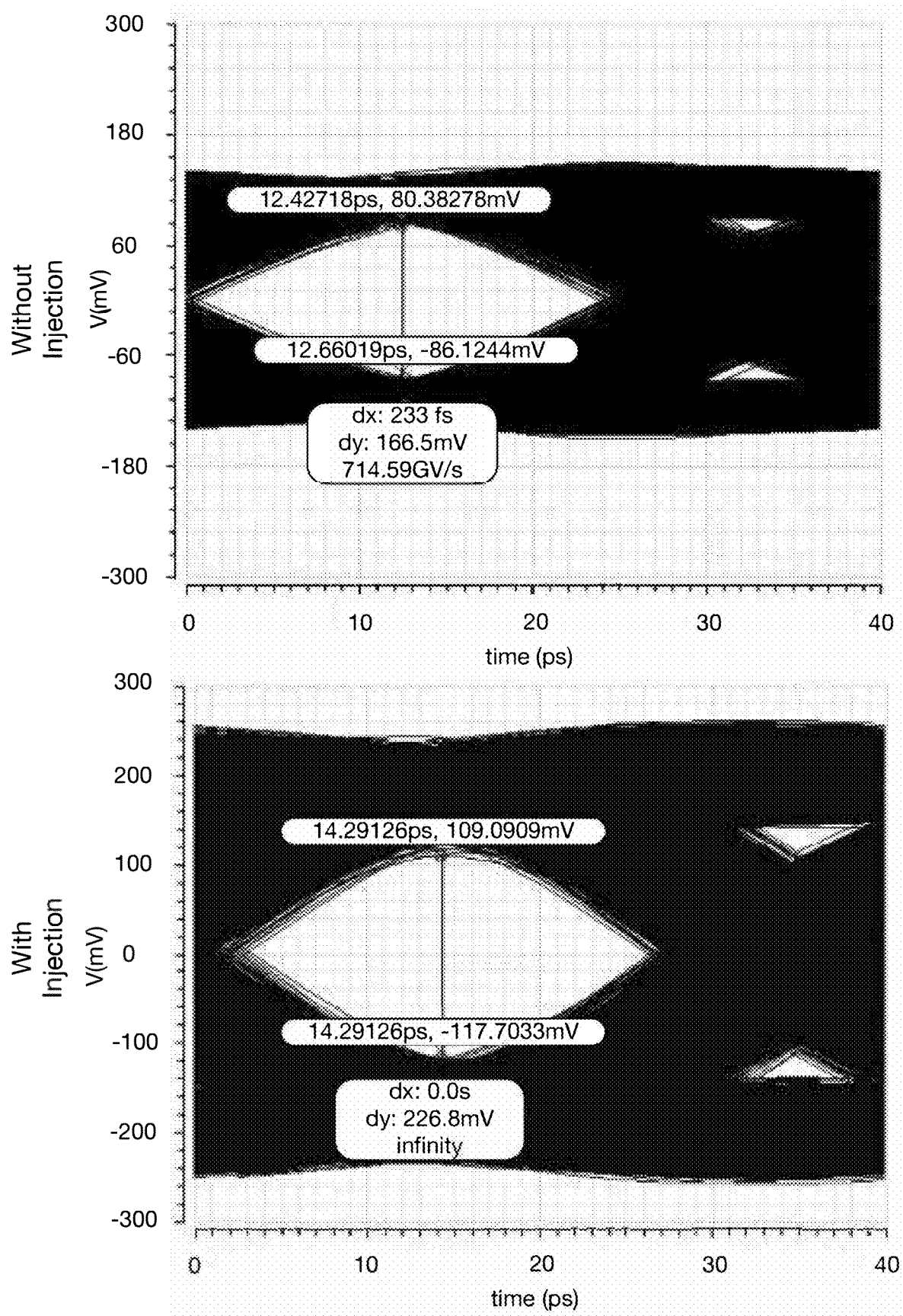
FIGS. 18, 19, and 20 illustrate simulated results of systems with and without high-frequency injection for a 12 mm, 24 mm, and 70 mm channel, respectively.
Figure 19:
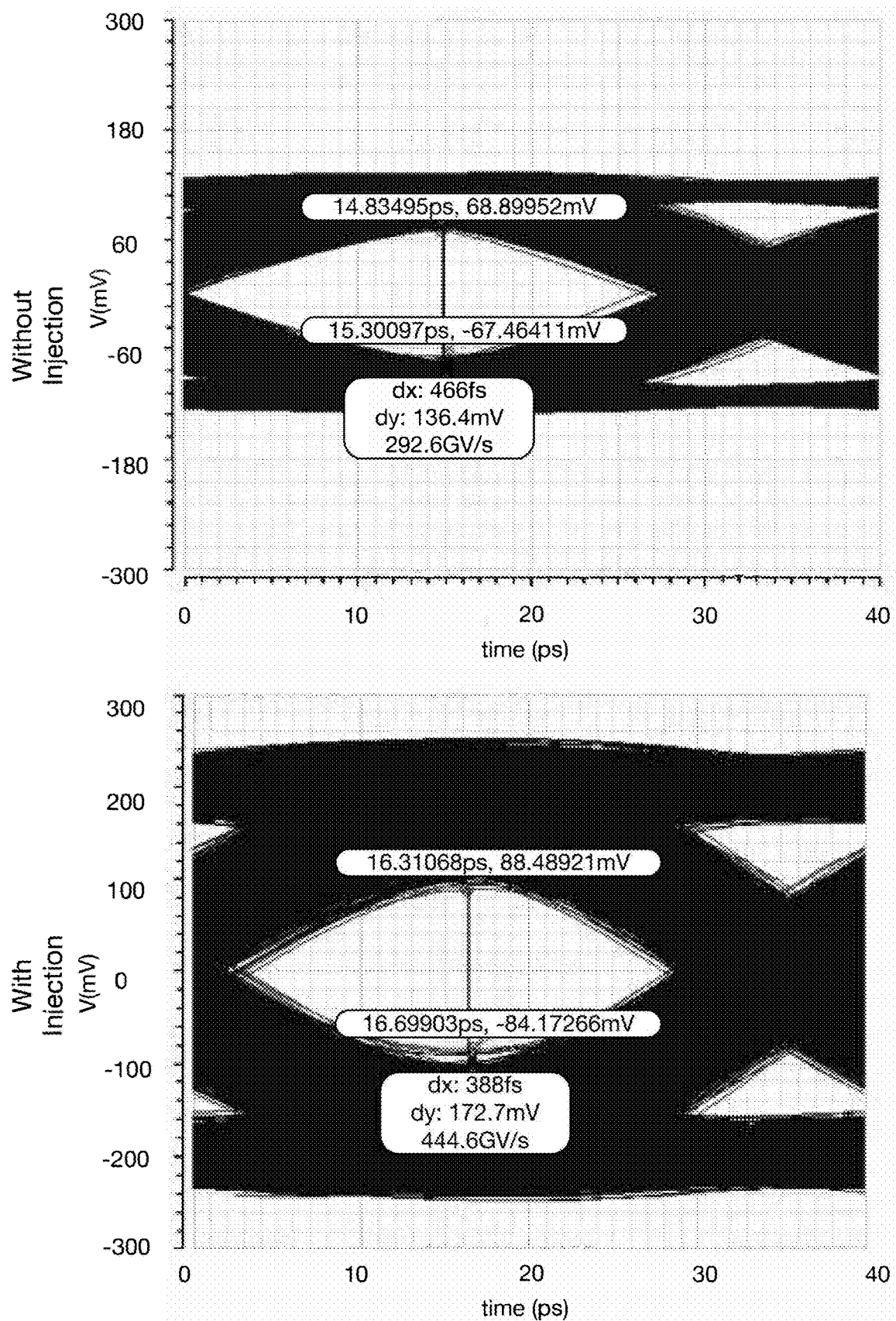
Figure 20:
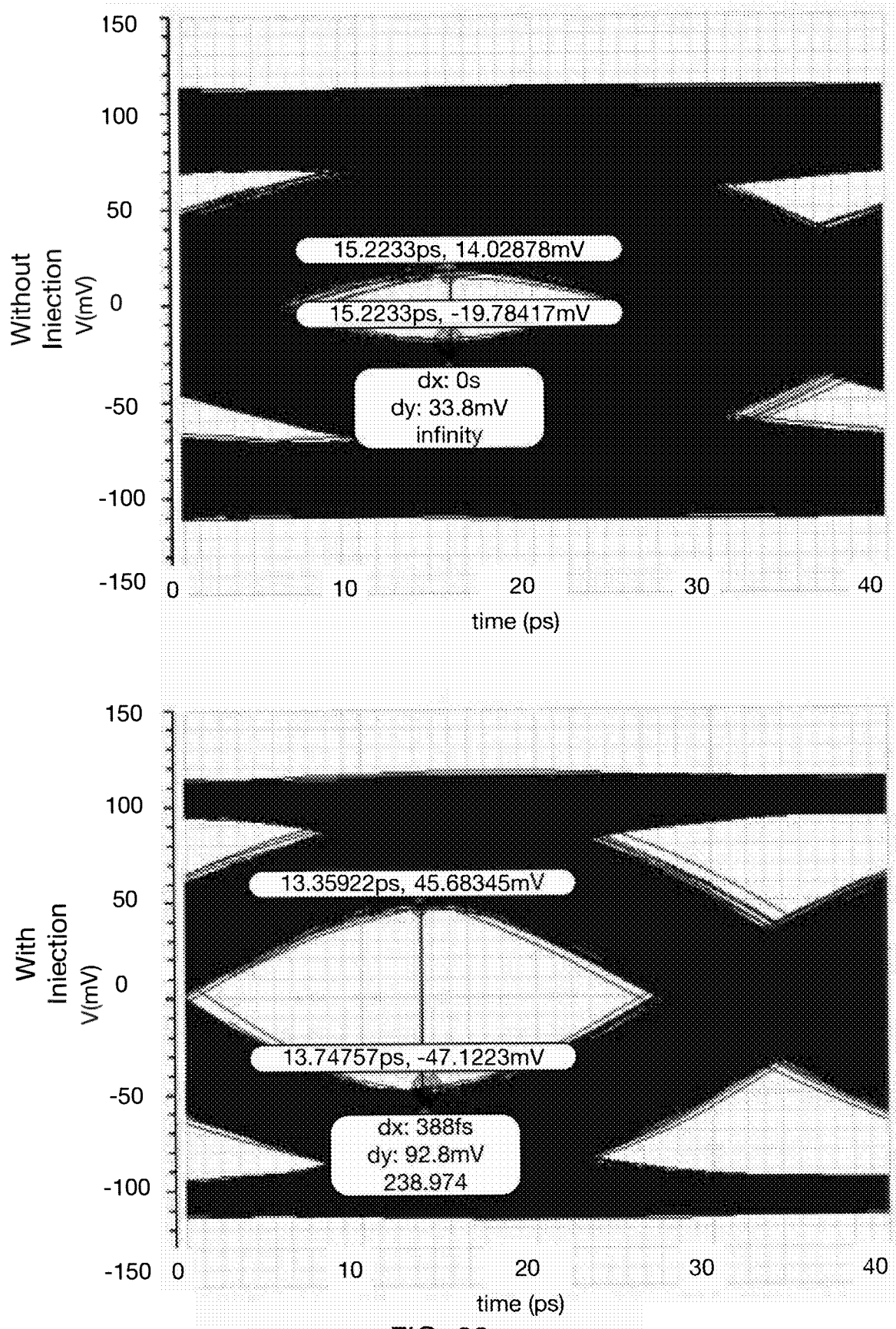

FIGS. 18, 19, and 20 illustrate simulated results of a given subchannel (Subch 4) for a 12 mm, 24 mm and 80 mm channel, respectively. The cutoff frequency for the high-pass filter is represented by Eqn. 6 below:

$$Fc = \frac{1}{2\pi(C + C_{in})R} \qquad \text{(Eqn. 6)}$$

wherein Cin is the input capacitance of the offset correction differential pair. Typical values may include: Cin=2fF, C=9fF, R=2 k-200 k.

FIG. 18 illustrates simulated results of a 12 mm channel, where R=200 k. As shown, the opening of the eye is increased from 166 mV to 226 mV with the injection of high-pass filtered versions of the MIC output signal.

FIG. 19 illustrates simulated results of a 24 mm channel, where R=200 k. As shown, the opening of the eye is increased from 136 mV to 172 mV with the injection of high-pass filtered versions of the MIC output signal.

FIG. 20 illustrates simulated results of a 70 mm channel, where R=2 k. As shown, the opening of the eye is increased from 33 mV to 92 mV with the injection of high-pass filtered versions of the MIC output signal.

The examples presented herein illustrate the use of vector signaling codes for point-to-point wire communications. However, this should not be seen in any way as limiting the scope of the described embodiments. The methods disclosed in this application are equally applicable to other communication media including optical and wireless communications. Thus, descriptive terms such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

Interpreting a set of signals as selecting an object (e.g., a data object) can include selecting the object based at least in part on the set of signals and/or one or more attributes of the set of signals. Interpreting a set of signals as representing an object (e.g., a data object) can include determining and/or selecting the object based at least in part on a representation corresponding to the set of signals. A same set of signals may be used to select and/or determine multiple distinct objects (e.g., data objects).

We claim:

1. An apparatus comprising:
    an integrator connected to a pair of output nodes, the integrator configured to initialize the pair of output nodes with a predetermined amount of charge responsive to a received periodic clock signal;
    a voltage sampler driver connected to the pair of output nodes, the voltage sampler driver configured to generate a differential output voltage on the pair of output nodes by modifying the predetermined amount of charge on the pair of output nodes according to first and second differential currents generated responsive to the received periodic clock signal, the voltage sampler driver comprising:

an input differential branch pair connected to the pair of output nodes, the input differential branch pair configured to receive a differential input signal and to responsively generate the first differential current through the pair of output nodes responsive to the periodic clock signal;

a high-pass filter configured to generate a high-pass filtered version of the differential input signal; and an offset voltage branch pair connected to the pair of output nodes, in parallel to the input differential branch pair, the offset voltage branch pair comprising a differential input summation node, the differential input summation node configured to receive (i) a differential offset voltage control signal and (ii) the high-pass filtered version of the differential input signal from an output of the high-pass filter, the offset voltage branch pair configured to generate the second differential current responsive to the periodic clock signal.

2. The apparatus of claim 1, wherein the integrator is configured to initialize the pair of output nodes by pre-charging the pair of output nodes, and wherein the voltage sampler driver is configured to modify the predetermined amount of charge on the pair of output nodes by discharging the pair of output nodes according to the first and second differential currents.

3. The apparatus of claim 1, wherein the integrator is configured to initialize the pair of output nodes by pre-discharging the pair of output nodes, and wherein the voltage sampler driver is configured to modify the predetermined amount of charge on the pair of output nodes by charging the pair of output nodes according to the first and second differential currents.

4. The apparatus of claim 1, wherein the integrator comprises a strongARM latch.

5. The apparatus of claim 1, wherein the integrator comprises a double-tail latch.

6. The apparatus of claim 1, wherein the differential offset voltage control signal corresponds to an offset correction for the voltage sampler driver.

7. The apparatus of claim 1, wherein the differential offset voltage control signal is associated in part with a decision feedback equalization (DFE) correction factor.

8. The apparatus of claim 1, wherein the differential input is received from an output of a multi-input comparator (MIC).

9. The apparatus of claim 1, wherein transistors in the offset voltage branch pair are scaled with respect to transistors in the input differential branch pair.

10. The apparatus of claim 1, wherein transistors in the offset voltage branch pair are matched with respect to transistors in the input differential branch pair.

11. A method comprising:
initializing, using an integrator, a pair of output nodes with a predetermined amount of charge responsive to a received periodic clock signal;

generating a first differential current through the pair of output nodes responsive to the periodic clock signal, the first differential current generated by an input differential branch pair connected to the pair of output nodes, the input differential branch pair receiving a differential input signal;

generating a high-pass filtered version of the differential input signal using a high-pass filter;

generating a second differential current through the pair of output nodes responsive to the periodic clock signal, the second differential current generated by an offset voltage branch pair connected to the pair of output nodes, in parallel to the input differential branch pair, the offset voltage branch pair comprising a differential input summation node, the differential input summation node configured receiving (i) a differential offset voltage control signal and (ii) the high-pass filtered version of the differential input signal from an output of the high-pass filter; and generating a differential output voltage on the pair of output nodes by modifying the predetermined amount of charge on the pair of output nodes according to a summation of the first and the second differential currents.

12. The method of claim 11, initializing the pair of output nodes comprises pre-charging the pair of output nodes, and wherein modifying the predetermined amount of charge on the pair of output nodes comprises discharging the pair of output nodes according to the first and second differential currents.

13. The method of claim 11, wherein initializing the pair of output nodes comprises pre-discharging the pair of output nodes, and wherein modifying the predetermined amount of charge on the pair of output nodes comprises charging the pair of output nodes according to the first and second differential currents.

14. The method of claim 11, wherein the integrator comprises a strongARM latch.

15. The method of claim 11, wherein the integrator comprises a double-tail latch.

16. The method of claim 11, wherein the differential offset voltage control signal corresponds to an offset correction for the voltage sampler driver.

17. The method of claim 11, wherein the differential offset voltage control signal is associated in part with a decision feedback equalization (DFE) correction factor.

18. The method of claim 11, wherein the differential input is received from an output of a multi-input comparator (MIC).

19. The method of claim 11, wherein transistors in the offset voltage branch pair are scaled with respect to transistors in the input differential branch pair.

20. The method of claim 11, wherein transistors in the offset voltage branch pair are matched with respect to transistors in the input differential branch pair.

* * * * *